United States Patent
Yuan et al.

(10) Patent No.: US 12,300,168 B2
(45) Date of Patent: May 13, 2025

(54) DISPLAY PANEL AND DISPLAY APPARATUS

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/026,827

(22) PCT Filed: Jun. 14, 2022

(86) PCT No.: PCT/CN2022/098747
§ 371 (c)(1),
(2) Date: Mar. 17, 2023

(87) PCT Pub. No.: WO2023/240465
PCT Pub. Date: Dec. 21, 2023

(65) Prior Publication Data
US 2024/0296793 A1    Sep. 5, 2024

(51) Int. Cl.
*G09G 3/3233*    (2016.01)
*H10K 59/131*    (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ........... H10K 59/00–95; H10K 59/131; H10K 59/353; H10K 59/1213; H10L 25/0753
See application file for complete search history.

(56) References Cited

U.S. PATENT DOCUMENTS

2016/0093250 A1*  3/2016  Lee ...................... H10K 59/131
                                                           257/40
2018/0240407 A1   8/2018  Chaji
(Continued)

FOREIGN PATENT DOCUMENTS

WO        01/31624 A1    5/2001
WO    2021/249101 A1    12/2021

OTHER PUBLICATIONS

Extended European search report of counterpart European application No. 22946164.5 issued on Nov. 4, 2024, 14 pages.

*Primary Examiner* — Sanjiv D. Patel
(74) *Attorney, Agent, or Firm* — XSENSUS LLP

(57) ABSTRACT

Provided is a display panel. The display panel includes: a substrate; a plurality of first control lines and a plurality of second control lines on a side of the substrate; and a plurality of subpixels arranged in an array on the side of the substrate, wherein at least two of the plurality of subpixels share a first node; wherein the subpixel includes a first circuit and a second circuit, the first circuit and the second circuit being configured to control a voltage at the first node in response to a first control signal and a second control signal; wherein in the display panel, a sum of a number of the plurality of first control lines and a number of the plurality of second control lines is less than or equal to a number of the subpixels in a column direction.

19 Claims, 28 Drawing Sheets

(52) U.S. Cl.
CPC ............... *G09G 2300/0819* (2013.01); *G09G 2300/0842* (2013.01); *G09G 2300/0861* (2013.01); *G09G 2310/08* (2013.01)

(56) References Cited

U.S. PATENT DOCUMENTS

2021/0118366 A1  4/2021  Xuan et al.
2024/0087516 A1  3/2024  Yuan et al.

\* cited by examiner

DISPLAY PANEL AND DISPLAY APPARATUS

CROSS-REFERENCE TO RELATED APPLICATIONS

This application is a U.S. national stage of international application No. PCT/CN2022/098747, filed on Jun. 14, 2022, the disclosure of which is incorporated herein by reference in its entirety.

TECHNICAL FIELD

The present disclosure relates to the field of display technologies, and in particular, relates to a display panel and a display apparatus.

BACKGROUND OF THE INVENTION

Organic light-emitting diode (OLED) display panels are widely used in the display field for their advantages of self-luminance, wide viewing angle, fast response and the like.

SUMMARY OF THE INVENTION

Embodiments of the present disclosure provide a display panel and a display apparatus. The technical solutions are as follows.

According to some embodiments of the present disclosure, a display panel is provided. The display panel includes:
a substrate;
a plurality of first control lines and a plurality of second control lines on a side of the substrate; and
a plurality of subpixels arranged in an array on the side of the substrate, wherein at least two of the plurality of subpixels share a first node.

The subpixel includes a first circuit and a second circuit. The first circuit is configured to control a voltage of the first node in response to a first control signal provided by the first control line. The second circuit is configured to control the voltage of the first node in response to a second control signal provided by the second control line.

In the display panel, a sum of a number of the plurality of first control lines and a number of the plurality of second control lines is less than or equal to a number of subpixels in a column direction.

In some embodiments, at least two subpixels in a same column in the plurality of subpixels share a target circuit and a target signal line; and
the target circuit includes the first circuit and the second circuit; and the target signal line includes the first control line and the second control line.

In some embodiments, a plurality of subpixels in the same column include a plurality of subpixel groups, the subpixel group includes two subpixels in different rows, and the subpixels included in the subpixel group share a target circuit and a target signal line.

In some embodiments, the subpixel group includes two subpixels in adjacent rows.

In some embodiments, at least two subpixels in a same row in the plurality of subpixels share the first circuit and the second circuit.

In some embodiments, the display panel includes a plurality of pixels arranged in an array, wherein the pixel includes at least two subpixels, and the at least two subpixels sharing the first circuit and the second circuit belong to the same pixel.

In some embodiments, the display panel further includes a plurality of first power lines and a plurality of second power lines on the side of the substrate; wherein
the first circuit is coupled to the first control line, the first power line, and the first node, and is configured to control, in response to the first control signal provided by the first control line, the first power line to be connected to or disconnected from the first node; and
the second circuit is coupled to the second control line, the second power line, and the first node, and is configured to control, in response to the second control signal provided by the second control line, the second power line to be connected to or disconnected from the first node.

In some embodiments, the first circuit includes a first transistor; and the second circuit includes a second transistor;
the first transistor includes a gate coupled to the first control line, a first electrode coupled to the first power line, and a second electrode coupled to the first node; and
the second transistor includes a gate coupled to the second control line, a first electrode coupled to the second power line, and a second electrode coupled to the first node.

In some embodiments, the subpixel further includes a third circuit and a light-emitting element, and the third circuit is coupled to the first node and the light-emitting element, and is configured to drive, in response to a potential of the first node, the light-emitting element to emit light.

In some embodiments, the display panel further includes a plurality of third control lines, a plurality of fourth control lines, and a plurality of data lines on the side of the substrate; wherein
the third circuit includes a first sub-circuit, a second sub-circuit, a third sub-circuit, and a fourth sub-circuit;
the first sub-circuit is coupled to the third control line, the data line, and a second node, and is configured to control, in response to a third control signal provided by the third control line, the data line to be connected to or disconnected from the second node;
the second sub-circuit is coupled to the fourth control line, the second node, and a third node, and is configured to control, in response to a fourth control signal provided by the fourth control line, the second node to be connected to or disconnected from the third node;
the third sub-circuit is coupled to the third node and the light-emitting element, and is configured to adjust a potential of the third node and a potential of the light-emitting element;
the fourth sub-circuit is coupled to the third node, the first node, and the light-emitting element, and is configured to drive, based on the potential of the first node and the potential of the third node, the light-emitting element to emit light; and
the target circuit shared by the at least two subpixels in the same column further includes the first sub-circuit; and the target signal line shared by the at least two subpixels in the same column further includes the third control line.

In some embodiments, the first sub-circuit includes a third transistor; the second sub-circuit includes a fourth transistor; the third sub-circuit includes a storage capacitor; and the fourth sub-circuit includes a fifth transistor;
the third transistor includes a gate coupled to the third control line, a first electrode coupled to the data line, and a second electrode coupled to the second node;

the fourth transistor includes a gate coupled to the fourth control line, a first electrode coupled to the second node, and a second electrode coupled to the third node;

the storage capacitor includes a first terminal coupled to the third node and a second terminal coupled to the light-emitting element; and the fifth transistor includes a gate coupled to the third node, a first electrode coupled to the first node, and a second electrode coupled to the light-emitting element.

In some embodiments, the display panel further includes a plurality of data line leads and a data line shared circuit on the side of the substrate, wherein a number of the plurality of data line leads is less than a number of the plurality of data lines; and the data line shared circuit is coupled to the plurality of data lines, and is further coupled to a source drive circuit through the plurality of data line leads, and the data line shared circuit is configured to transmit a data signal transmitted by the source drive circuit to one of the data line leads to at least two of the plurality of data lines in a time-sharing manner.

In some embodiments, the display panel further includes a plurality of fifth control lines and a plurality of third power lines on the side of the substrate; wherein the subpixel further includes a fourth circuit, and the fourth circuit is coupled to the fifth control line, the third power line, and the third node, and is configured to control, in response to a fifth control signal provided by the fifth control line, the third power line to be connected to or disconnected from the third node.

In some embodiments, the fourth circuit includes a sixth transistor; and the sixth transistor includes a gate coupled to the fifth control line, a first electrode coupled to the third power line, and a second electrode coupled to the third node.

In some embodiments, the target signal line shared by the at least two subpixels in the same column further includes the third power line.

In some embodiments, the third power line extends in a first direction;

the fourth control lines and the fifth control lines to which two subpixels located in two adjacent rows and sharing the third power line in the plurality of subpixels are coupled all extend in the first direction, are sequentially arranged close to the third power line in a second direction, and are distributed on two sides of the third power line, the second sub-circuits included in the two subpixels in the two adjacent rows are distributed on the two sides of the third power line, the fourth circuits included in the two subpixels in the two adjacent rows are distributed on the two sides of the third power line, and the second sub-circuits and the fourth circuits are sequentially arranged in a direction close to the third power line; and the first direction intersects the second direction.

In some embodiments, the second control line, the second power line, and the first control line all extend in a first direction and are sequentially arranged in a second direction, the first control line and the second control line are distributed on different sides of the second power line, and the second control line and the first control line are not equidistant from the second power line in the second direction;

two subpixels located in two adjacent rows and sharing the first circuit, the second circuit, the first sub-circuit, the first control line, the second control line, and the third control line in the plurality of subpixels are arranged on two sides of the second power line, and the third power lines, the fifth control lines, and the fourth control lines to which the two subpixels in the two adjacent rows are coupled all extend in the first direction, are sequentially arranged close to the second power line in the second direction, and are arranged on the two sides of the second power line; and the first direction intersects the second direction.

In some embodiments, the third control line to which the two subpixels in the two adjacent rows are coupled includes a first portion and a second portion, and the first power line includes a first portion and a second portion; and the first portion of the third control line and the first portion of the first power line are sequentially arranged in the first direction and extend in the second direction, the second portion of the third control line and the second portion of the first power line are sequentially arranged in the second direction and extend in the first direction, the second portion of the third control line is located on a side of the second control line away from the second power line, the second portion of the first power line is located on a side of the first control line away from the second power line, the data lines to which the two subpixels in the two adjacent rows are coupled extend in the second direction, are sequentially arranged in the first direction, and are located between the first portion of the third control line and the first portion of the first power line, and the first direction intersects the second direction.

In some embodiments, the second power line, the second control line, and the first control line all extend in a first direction and are sequentially arranged in a second direction, the first control line and the second control line are located on a same side of the second power line, and the first control line and the second power line are not equidistant from the second control line in the second direction;

two subpixels located in two adjacent rows and sharing the first circuit, the second circuit, the first sub-circuit, the first control line, the second control line, and the third control line in the plurality of subpixels are arranged on two sides of the second control line, and the third power lines, the fifth control lines, and the fourth control lines to which the two subpixels in the two adjacent rows are coupled all extend in the first direction, are sequentially arranged close to the second control line in the second direction, and are arranged on the two sides of the second control line; and the first direction intersects the second direction.

In some embodiments, the third control line to which the two subpixels in the two adjacent rows are coupled includes a first portion and a second portion, and the first power line includes a first portion and a second portion; and the first portion of the third control line and the first portion of the first power line are sequentially arranged in the first direction and extend in the second direction, the second portion of the third control line and the second portion of the first power line are sequentially arranged in the second direction and extend in the first direction, the second portion of the third control line is located on a side of the second power line away from the second control line, the second portion of the first power line is located on a side of the first control line away from the second control line, the data lines to which the two subpixels in the two adjacent rows are coupled extend in the second direction, are sequentially arranged in the first direction, and are located between the first portion of the third control line and the first portion of the first power line, and the first direction intersects the second direction.

In some embodiments, the second transistor included in the second circuit shared by the two subpixels in the two adjacent rows is coupled to the second power line through a via hole; and the via hole through which the second transistor is coupled to the second power line is approximately equidistant from the two subpixels in the two adjacent rows in the second direction.

In some embodiments, the display panel further includes an active layer located between the substrate and the light-emitting element, wherein the active layer includes active regions of the transistors in each subpixel;

for one subpixel, an active layer of the subpixel includes a first portion and a second portion arranged at intervals in the second direction, the first portion includes an active region of the sixth transistor and an active region of the fourth transistor in the subpixel, and the second portion includes an active region of the fifth transistor;

in the two subpixels in the two adjacent rows, the first portion of the active layer of one subpixel further includes an active region of the shared third transistor;

the active layer of the two subpixels in the two adjacent rows further includes a third portion and a fourth portion that are arranged at intervals in the first direction and are shared, the third portion includes an active region of the shared first transistor, the fourth portion includes an active region of the shared second transistor, and the third portion and the second portion of the active layer of each subpixel are integrated; and the first portion, the second portion, the third portion, and the fourth portion of the active layer each include a conducting region, an orthographic projection of the conducting region on the substrate does not overlap an orthographic projection of the active region on the substrate, and the conducting region of the second portion and the conducting region of the third portion are used to couple the two subpixels in the two adjacent rows.

In some embodiments, in the second direction, for each subpixel, a sum of a length of the conducting region of the second portion and a length of the conducting region of the third portion of the subpixel is 0.8 to 1.2 times a length of the subpixel.

In some embodiments, the display panel further includes a first conductive layer on a side of the active layer away from the substrate, wherein the first conductive layer includes the gates of the transistors and a first plate of the storage capacitor in the subpixel;

for one subpixel, a first conductive flayer of the subpixel includes a first portion, a second portion, and a third portion arranged at intervals in the second direction, the first portion includes the gate of the sixth transistor in the subpixel, the second portion includes the gate of the fourth transistor, the third portion includes the first plate of the storage capacitor and the gate of the fifth transistor in the subpixel;

in the two subpixels in the two adjacent rows, the first conductive layer of one subpixel further includes a fourth portion located between the second portion and the third portion, and the fourth portion includes the gate of the shared third transistor;

the first conductive layer of the two subpixels in the two adjacent rows further includes a fifth portion and a sixth portion that are arranged at intervals in the first direction and are shared, the fifth portion includes the gate of the shared first transistor, and the sixth portion includes the gate of the shared second transistor; and for each transistor, an orthographic projection of the gate of the transistor on the substrate overlaps an orthographic projection of the active region of the transistor on the substrate.

In some embodiments, the display panel further includes a second conductive layer on a side of the first conductive layer away from the substrate, wherein the second conductive layer includes second plates of the storage capacitors in the subpixels;

the second conductive layer further includes the third power lines and the first portions of the third control lines;

in the second conductive layer, the second plates of the storage capacitors in the subpixels are spaced from each other, and for each subpixel, an orthographic projection of the first plate of the storage capacitor in the subpixel on the substrate overlaps an orthographic projection of the second plate on the substrate; and an orthographic projection of the third power line in the second conductive layer on the substrate overlaps an orthographic projection of the first portion of the active layer of each subpixel on the substrate.

In some embodiments, the display panel further includes a first insulating layer and a third conductive layer sequentially stacked on a side of the second conductive layer away from the substrate, and a plurality of first via holes penetrating through the first insulating layer;

the third conductive layer includes the first control lines, the second control lines, the second portions of the third control lines, the fourth control lines, the fifth control lines, the second power lines, the second portions of the first power lines, and a plurality of first connection portions and a plurality of second connection portions in one-to-one correspondence with the plurality of subpixels, and the plurality of first connection portions and the plurality of second connection portions are spaced apart from each other in the first direction and the second direction;

the first connection portion corresponding to each subpixel has one end coupled to the second portion of the active layer of the subpixel through the first via hole and the other end coupled to the light-emitting element in the subpixel, to couple the second electrode of the fifth transistor, the light-emitting element, and the first plate of the storage capacitor to each other;

the second connection portion is coupled to the first portion of the active layer of the subpixel through the first via hole, to couple the first plate of the storage capacitor, the second electrode of the fourth transistor, and the second electrode of the sixth transistor to each other;

an orthographic projection of the first control line in the third conductive layer on the substrate overlaps an orthographic projection of the gate of the first transistor on the substrate, and the gate of the first transistor is coupled to the first control line through the first via hole;

an orthographic projection of the second control line in the third conductive layer on the substrate overlaps an orthographic projection of the gate of the second transistor on the substrate, and the gate of the second transistor is coupled to the second control line through the first via hole;

an orthographic projection of the second portion of the third control line in the third conductive layer on the substrate overlaps an orthographic projection of the gate of the third transistor on the substrate, and the gate of the third transistor is coupled to the third control line through the first via hole;

an orthographic projection of the fourth control line in the third conductive layer on the substrate overlaps an orthographic projection of the gate of the fourth transistor on the substrate, and the gate of the fourth transistor is coupled to the fourth control line through the first via hole;

an orthographic projection of the fifth control line in the third conductive layer on the substrate overlaps an orthographic projection of the gate of the sixth transistor on the substrate, and the gate of the sixth transistor is coupled to the fifth control line through the first via hole;

an orthographic projection of the second power line in the third conductive layer on the substrate overlaps an orthographic projection of the fourth portion of the active layer of the subpixel on the substrate, and the first electrode of the second transistor is coupled to the second power line through the first via hole;

the orthographic projection of the third power line in the second conductive layer on the substrate overlaps the orthographic projection of the first portion of the active layer of the subpixel on the substrate, and the first electrode of the sixth transistor is coupled to the third power line through the first via hole; and an orthographic projection of the first portion of the third control line in the second conductive layer on the substrate overlaps the orthographic projection of the second portion of the third control line in the third conductive layer on the substrate, and the first portion and the second portion of the third control line are coupled to each other through the first via hole to form the third control line.

In some embodiments, the light-emitting element includes an anode layer on the side of the substrate; and the display panel further includes a second insulating layer and a fourth conductive layer sequentially stacked on a side of the third conductive layer away from the substrate, and a plurality of second via holes penetrating through the second insulating layer;

the fourth conductive layer includes the first portions of the first power lines and the data lines;

an orthographic projection of the first portion of the first power line in the fourth conductive layer on the substrate overlaps an orthographic projection of the second portion of the first power line in the third conductive layer on the substrate, and the first portion and the second portion of the first power line are coupled to each other through the second via hole to form the first power line;

an orthographic projection of the data line in the fourth conductive layer on the substrate overlaps an orthographic projection of the first portion of the active layer of the subpixel on the substrate, and the first electrode of the third transistor is coupled to the data line through the first via hole; and the other end of the first connection portion is coupled to the anode layer of the light-emitting element through the second via hole to couple the second electrode of the fifth transistor, the second plate of the storage capacitor, and the light-emitting element to each other.

In some embodiments, the first circuit and the second circuit shared by the two subpixels in the two adjacent rows are sequentially arranged in a third direction, and the first circuit and the second circuit are not equidistant from the same subpixel in the two subpixels in the two adjacent rows; and the third direction intersects the first direction and the second direction.

In some embodiments, each transistor included in the subpixel is an N-type transistor, and a material of the N-type transistor includes low temperature polysilicon (LTPS).

According to some embodiments of the present disclosure, a display apparatus is provided, including a display drive circuit and the display panel according to the foregoing embodiments.

The display drive circuit is coupled to signal lines in the display panel, and is configured to provide signals to the signal lines.

BRIEF DESCRIPTION OF DRAWINGS

For a clearer description of the technical solutions in the embodiments of the present disclosure, the following briefly describes the accompanying drawings required for describing the embodiments. The accompanying drawings in the following description show merely some embodiments of the present disclosure, and those of ordinary skill in the art may still derive other drawings from these accompanying drawings without creative effort.

DETAILED DESCRIPTION OF THE INVENTION

Figure 1:
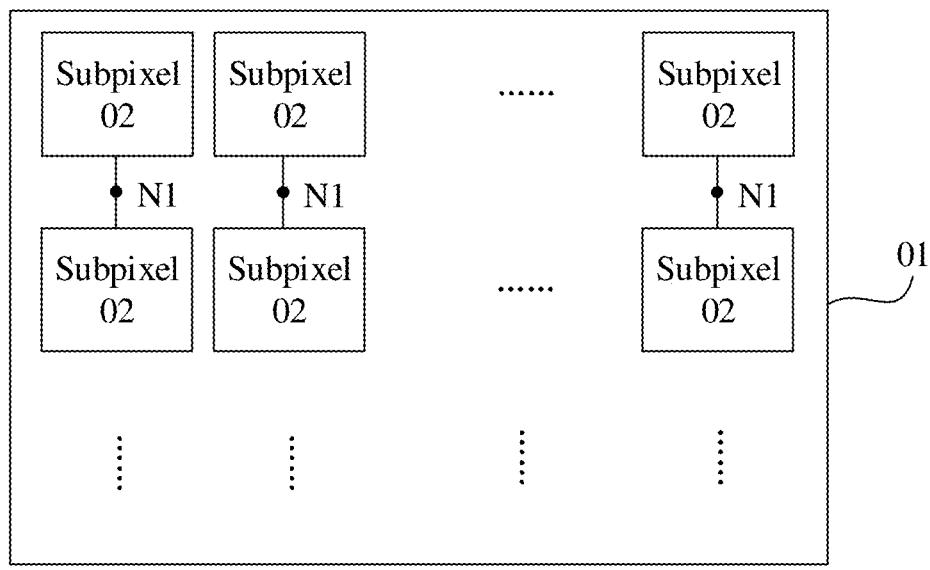
FIG. 1 is a schematic structural diagram of a display panel according to some embodiments of the present disclosure.

To make the objectives, technical solutions, and advantages of the present disclosure clearer, the embodiments of the present disclosure are further described in detail below with reference to the accompanying drawings.

In some practices, an OLED display panel generally includes a substrate and a plurality of subpixels on a side of the substrate. Each subpixel includes a pixel circuit and a light-emitting element. The pixel circuit is coupled to a plurality of signal lines and the light-emitting element, and is configured to drive the light-emitting element to emit light based on signals provided by the plurality of signal lines.

However, a large number of signal lines need to be disposed in the display panel in some practices, which is unfavorable for the high-resolution design of the display panel.

Transistors used in all embodiments of the present disclosure are thin film transistors, field effect transistors, or other devices having the same characteristics. The transistors in the embodiments of the present disclosure are mainly switching transistors based on their functions in circuits. Because a source and drain of the switching transistor are symmetrical, the source and drain are interchangeable. In the embodiments of the present disclosure, the source is referred to as a first electrode and the drain is referred to as a second electrode, or the drain is referred to as the first electrode and the source is referred to as the second electrode. According to the form in the accompanying drawings, a middle terminal of the transistor is a gate, a signal input terminal is the source, and a signal output terminal is the drain. In addition, the switching transistors in the embodiments of the present disclosure include any one of an N-type switching transistor and a P-type switching transistor. The N-type switching transistor is turned on when the gate is at a high level and turned off when the gate is at a low level. The P-type switching transistor is turned on when the gate is at the low level and turned off when the gate is at the high level. A plurality of signals each have a first potential and a second potential. The first potential and the second potential only represent that the potential of the signal has two state quantities, but do not represent that the first potential or the second potential has a specific value in the whole text.

With the rapid development of display technologies, high-resolution display products (e.g., e-sports display products), which can better improve user experience, are increasingly popular with users. The resolution is measured by the number of pixels per inch (PPI) in a display panel. The higher the PPI, the higher the resolution. Conversely, the lower the PPI, the lower the resolution. However, in current display panels, a large number of signal lines are disposed, and each subpixel (generally, a plurality of subpixels belong to one pixel) includes a large number of circuits. So, the structure is complex, which is unfavorable for the high-PPI design of the display panel.

In view of this, the embodiments of the present disclosure provide a new display panel. In comparison with the current display panel, in the display panel provided in the embodiments of the present disclosure, a small number of signal lines are disposed, and each subpixel includes a small number of circuits. So, the structure is simple, which facilitates the high-PPI design of the display panel and better meets user requirements.

FIG. 1 is a schematic structural diagram of a display panel according to some embodiments of the present disclosure. As shown in FIG. 1, the display panel includes a substrate 01 and a plurality of subpixels 02 arranged in an array on a side of the substrate 01. The array arrangement refers to that the subpixels are sequentially arranged in a row direction and a column direction. That is, the plurality of subpixels 02 includes a plurality of rows and columns of subpixels 02. At least two subpixels 02 share a first node N1. For example, in the display panel shown in FIG. 1, every two adjacent subpixels 02 in the same column share the same first node N1.

Figure 2:
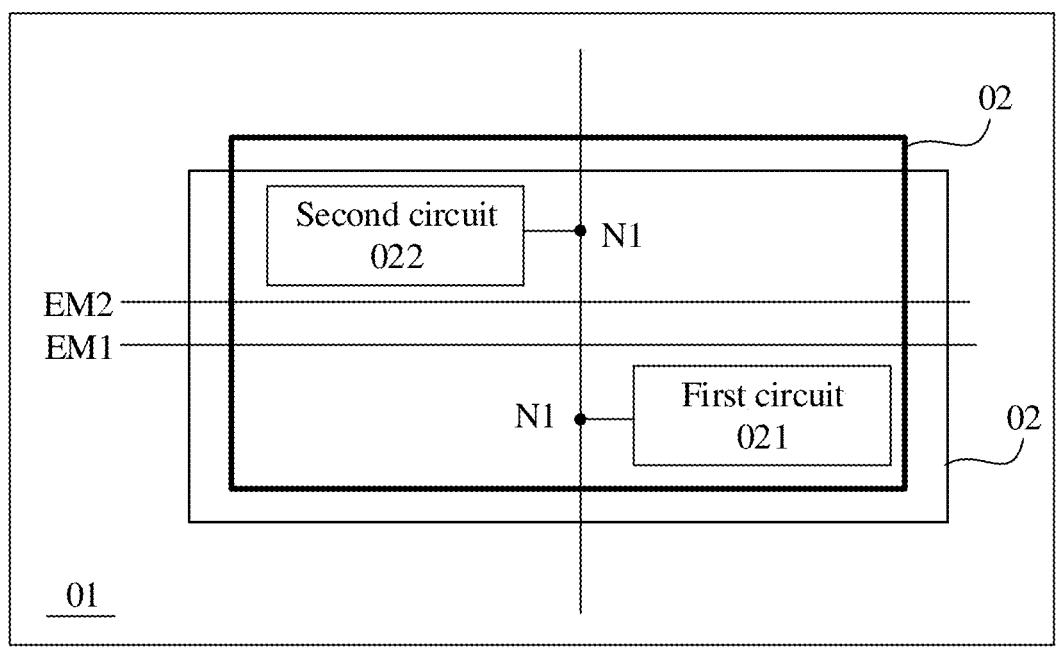
FIG. 2 is a schematic structural diagram of two subpixels in a display panel according to some embodiments of the present disclosure.

With reference to FIG. 2, the display panel further includes a plurality of first control lines EM1 and a plurality of second control lines EM2 on the side of the substrate 01. Each subpixel 02 includes a first circuit 021 and a second circuit 022.

The first circuit 021 is configured to control a voltage at the first node N1 in response to a first control signal provided by the first control line EM1. The second circuit 022 is configured to control the voltage at the first node N1 in response to a second control signal provided by the second control line EM2. It can be learned that in the at least two subpixels 02 sharing the first node N1, the first circuit 021 and the second circuit 022 jointly control the voltage at the first node N1.

In some practices, because no node or circuit is shared, the first circuits 021 of the plurality of subpixels 02 are generally coupled to the plurality of first control lines EMI in a one-to-one correspondence, and the second circuits 022 are generally coupled to the plurality of second control lines EM2 in a one-to-one correspondence. Therefore, in the display panel, the sum of the number of the plurality of first control lines EM1 and the number of the plurality of second control lines EM2 is twice the number of the subpixels 02 in the column direction.

On the basis that the first node N1 is shared, in the display panel provided in the embodiments of the present disclosure, the sum of the number of the plurality of first control lines EMI and the number of the plurality of second control lines EM2 is less than or equal to the number of the subpixels 02 in the column direction (i.e., a pixel column direction), that is, is not greater than the number of the subpixels 02 in the same column. It can be learned that in the embodiments of the present disclosure, the number of the signal lines that need to be disposed in the display panel can be reduced by sharing the node, which facilitates high-PPI design of the display panel.

In summary, the embodiments of the present disclosure provide a display panel. The display panel includes a plurality of subpixels on a side of a substrate. Each subpixel includes a first circuit and a second circuit. The first circuit and the second circuit control the voltage at the first node under the control of the first control line and the second control line. Because at least two subpixels in the plurality of subpixels share the same first node, the sum of the number of the plurality of first control lines and the number of the plurality of second control lines in the display panel can be less than or equal to the number of the subpixels in the column direction. Therefore, a small number of signal lines need to be disposed in the display panel, which facilitates the high-resolution design of the display panel.

Figure 3:
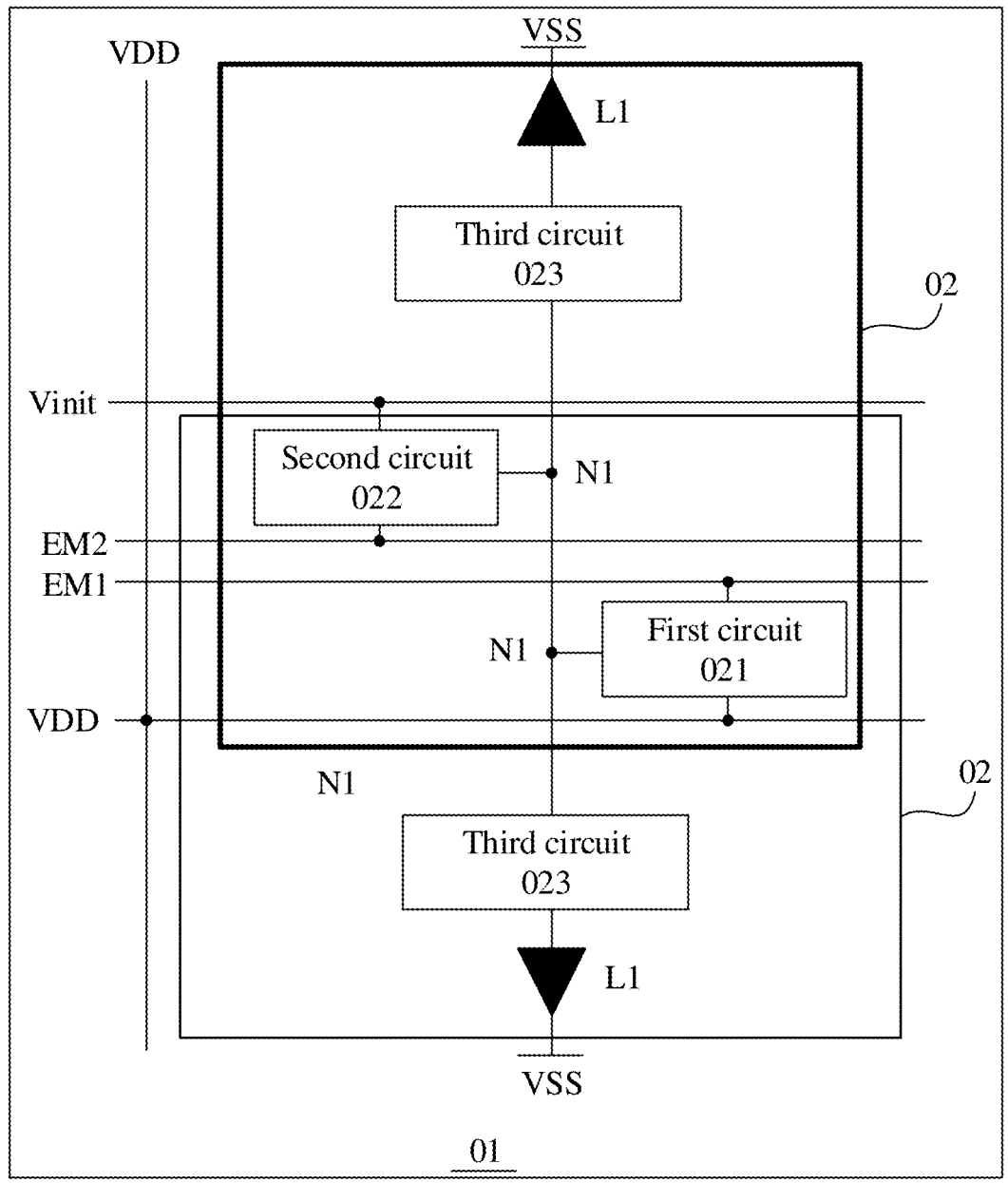
FIG. 3 is a schematic structural diagram of two subpixels in another display panel according to some embodiments of the present disclosure.

In some embodiments, FIG. 3 is a schematic structural diagram of another display panel according to some embodiments of the present disclosure. As shown in FIG. 3, the display panel further includes a plurality of first power lines VDD and a plurality of second power lines Vinit on a side of the substrate 01. Each subpixel 02 further includes a third circuit 023 and a light-emitting element L1.

The first circuit 021 is coupled to the first control line EM1, the first power line VDD, and the first node N1, and is configured to control, in response to the first control signal provided by the first control line EM1, the first power line VDD to be connected to or disconnected from the first node N1.

For example, the first circuit 021 controls the first power line VDD to be connected to the first node N1 when a potential of the first control signal is a first potential. In this case, a first power signal provided by the first power line VDD is transmitted to the first node N1 to charge the first node N1. The first circuit 021 controls the first power line VDD to be disconnected from the first node N1 when the potential of the first control signal is a second potential. In some embodiments, the first potential is a valid potential, the second potential is an invalid potential, and the first potential is a high potential relative to the second potential.

In the embodiments of the present disclosure, the first circuit 021 is also referred to as a light emission control circuit. The first power line VDD is also referred to as a charging power line. Correspondingly, the first power signal is also referred to as a charging power signal. The first control line EM1 is also referred to as a light emission control line. Correspondingly, the first control signal is also referred to as a light emission control signal.

The second circuit 022 is coupled to the second control line EM2, the second power line Vinit, and the first node N1. That is, the second circuit 022 and the first circuit 021 are both coupled to the first node N1. The second circuit 022 is configured to control, in response to the second control signal provided by the second control line EM2, the second power line Vinit to be connected to or disconnected from the first node N1.

For example, the second circuit 022 controls the second power line Vinit to be connected to the first node N1 when a potential of the second control signal is the first potential. In this case, a second power signal provided by the second power line Vinit is transmitted to the first node N1 to reset the first node N1. The second circuit 022 controls the second power line Vinit to be disconnected from the first node N1 when the potential of the second control signal is the second potential.

In the embodiments of the present disclosure, the second circuit 021 is also referred to as a first reset circuit. The second power line Vinit is also referred to as an initial power line. Correspondingly, the second power signal is also referred to as an initial power signal. The second control line EM2 is also referred to as a reset control line. Correspondingly, the second control signal is also referred to as a reset control signal.

The third circuit 023 is coupled to the first node N1 and the light-emitting element L1. The third circuit 023 is configured to drive, in response to a potential at the first node N1, the light-emitting element L1 to emit light.

For example, referring to FIG. 3, the light-emitting element L1 has a first electrode and a second electrode. The third circuit 023 is coupled to the first electrode of the light-emitting element L1. The second electrode of the light-emitting element L1 is coupled to a pull-down power line VSS. The third circuit 023 transmits a light emission driving signal (for example, driving current) to the first electrode of the light-emitting element L1 based on the potential at the first node N1. The light-emitting element L1 emits light under the action of a voltage difference between the light emission driving signal and a pull-down power signal that is provided by the pull-down power line VSS and received by the second electrode.

In some embodiments, one of the first electrode and the second electrode of the light-emitting element L1 is an anode, and the other is a cathode. In the embodiments of the present disclosure, the first electrode of the light-emitting element L1 is the anode, and the second electrode is the cathode.

The third circuit 023 is also referred to as a light emission driving circuit. With reference to the foregoing embodiments, the first circuit 021, the second circuit 022, and the third circuit 023 are collectively referred to as a pixel circuit.

In the embodiments of the present disclosure, on the basis that at least two subpixels 02 share the first node N1, the at least two subpixels 02 further share a target circuit and a target signal line.

For example, as can be seen from FIG. 2 and FIG. 3, the shared target circuit includes the first circuit 021 and the second circuit 022. The shared target signal line includes the first control line EM1 and the second control line EM2. That is, the at least two subpixels 02 share the same first circuit 021, the same second circuit 022, the same first control line EM1, and the same second control line EM2.

With reference to sharing of the first node N1, it can be known that sharing the same circuit by the at least two subpixels 02 refers to that the at least two subpixels 02 operate under the control of the same circuit. Correspondingly, the at least two subpixels 02 simultaneously perform some operations. For example, the at least two subpixels 02 sharing the first circuit 021 simultaneously charge the first nodes N1, and at least two subpixels 02 sharing the second circuit 022 simultaneously reset the first nodes N1.

For example, FIG. 3 shows two subpixels 02 in the same column. The two subpixels 02 share the same first circuit 021 and the same second circuit 022. Therefore, the two subpixels 02 include four circuits, i.e., one first circuit 021, one second circuit 022, and two third circuits 023. After the four circuits are equally divided between the two subpixels 02, each subpixel 02 includes only two circuits. In some practices, because different subpixels 02 share no circuit, each subpixel in some practices includes three circuits on the basis of including the same types of circuits (such as the first circuit 021, the second circuit 022, and the third circuit 023). Therefore, in the plurality of subpixels 02 provided in the embodiments of the present disclosure, the number of circuits included in each of the subpixels 02 sharing the target circuit is significantly reduced, and correspondingly, the structure is simple, which further facilitates the high-PPI design of the display panel.

The two subpixels 02 shown in FIG. 3 further share the same first control line EM1 and the same second control line EM2. On this basis, in the case that every two subpixels 02 share the control line in this way, the number of the first control lines EM1 in the display panel is ½ of the number of the subpixels in the column direction, and the number of the second control lines EM2 is also ½ of the number of the subpixels in the column direction. Therefore, in the display panel, the sum of the number of the plurality of first control lines EM1 and the number of the plurality of second control lines EM2 is equal to the number of the subpixels 02 in the column direction.

Referring to FIG. 2 and FIG. 3, it can be seen that in the plurality of subpixels 02 included in the display panel, at least two subpixels 02 in the same column share the target circuit and the target signal line.

As described in the foregoing embodiments, the target circuit at least includes the first circuit 021 and the second circuit 022. That is, at least two subpixels 02 sharing the same first circuit 021 are disposed in the same column, and at least two subpixels 02 sharing the same second circuit 022 are disposed in the same column.

On this basis, as described in the foregoing embodiments, the at least two subpixels 02 sharing the target circuit and disposed in the same column further share the target signal line. For example, on the premise that the shared target circuit includes the second circuit 022 and the first circuit 021, as can be seen from FIG. 3, the target signal line at least includes the first control line EM1 and the second control line EM2. Certainly, the target signal line may further include the second power line Vinit.

In this way, with reference to the description of the foregoing embodiments, it can be seen that according to the design of the display panel in the embodiments of the present disclosure, not only the number of circuits included in each of the subpixels 02 sharing the target circuit can be reduced, but also the number of signal lines that need to be disposed in the display panel can be reduced. Therefore, the density of the signal lines in the display panel and the load on each signal line is reduced, which effectively optimizes the layout space, and improves the product yield.

In addition, the first control line EM1 and the second control line EM2 are generally coupled to a gate driver on array (GOA) circuit (also referred to as a gate drive circuit), and respectively receive a light emission control signal and a reset control signal provided by the GOA circuit. That is, the subpixel 02 operates under the drive of the GOA circuit. Therefore, the number of signal lines to which the GOA circuit is coupled decreases as the number of the first control lines EM1 and the number of the second control lines EM2 decrease, and thus the driving capability and operating power consumption of the GOA circuit can be reduced. Moreover, because the output capability of the GOA circuit is generally positively correlated with a width-to-length ratio (reflected in an occupied area) of an output transistor included in the GOA circuit, the occupied area of the output transistor in the GOA circuit can be further reduced, which facilitates the narrow-frame design of the display panel.

Figure 4:
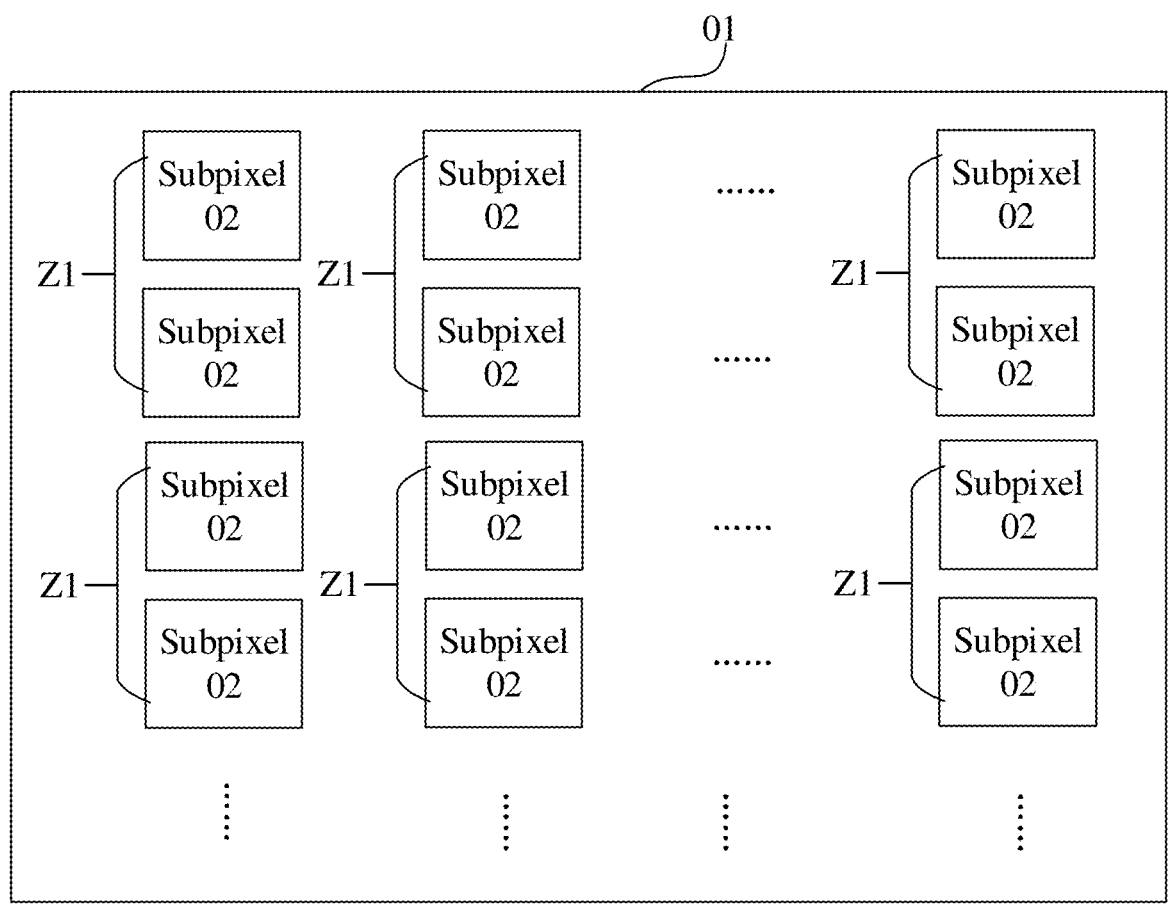
FIG. 4 is a schematic structural diagram of another display panel according to some embodiments of the present disclosure.

In some embodiments, referring to FIG. 4, the plurality of subpixels 02 in the same column includes a plurality of subpixel groups Z1. Each subpixel group Z1 includes two subpixels 02 in different rows, and the two subpixels 02 share a target circuit and a target signal line. With reference to FIG. 2, in the display panel, every two subpixels 02 in the same column share the same second circuit 022 and the same third circuit 023. On this basis, every two subpixels 02 in the same column further share the same first control line EM1 and the same second control line EM2.

In some embodiments, each subpixel group Z1 includes two subpixels 02 in adjacent rows. For example, the two subpixels 02 in each subpixel group Z1 are disposed in an even row and an odd row. That is, in every two subpixels 02 sharing the target circuit and the target signal line and disposed in the same column, one subpixel 02 is disposed in an odd row, and the other subpixel 02 is disposed in an even row, and the odd row and the even row are adjacent.

In some embodiments, the two subpixels 02 in each subpixel group Z1 are disposed in two adjacent rows on the basis of being disposed in the odd row and the even row. That is, for the subpixels 02 in the same column, from the subpixel 02 in the first row, the subpixels 02 in every two adjacent rows share the target circuit and the target signal line. This can facilitate layout and arrangement of the signal lines such that each signal line is short and the load on each signal line is small.

For example, assuming that the display panel includes M rows and N columns of subpixels 02, wherein M and N are integers greater than 0, then for the subpixels 02 in any of the N columns, the subpixel 02 in the $m^{th}$ row and the subpixel 02 in the $(m+1)^{th}$ row share the target circuit and the target signal line, where m is an odd number and is greater than 0 and less than or equal to M. Taking the subpixels 02 in the first column as an example, the subpixel 02 in the first (m=1) row and the subpixel 02 in the second row share the target circuit and the target signal line, the subpixel 02 in the third (m=3) row and the subpixel 02 in the fourth row share the target circuit and the target signal line, and so on.

Certainly, in some other embodiments, all subpixels 02 in the same column share the target circuit and the target signal line. Alternatively, two subpixels 02 in the same column and two non-adjacent rows share the target circuit and the target signal line. Alternatively, every three or more subpixels 02 in the same column and different rows share the target circuit and the target signal line. The following embodiments are illustrated by taking an example in which the subpixels 02 sharing the target circuit and the target signal line are two subpixels 02 in the same column and an odd row and an even row that are adjacent.

Figure 5:
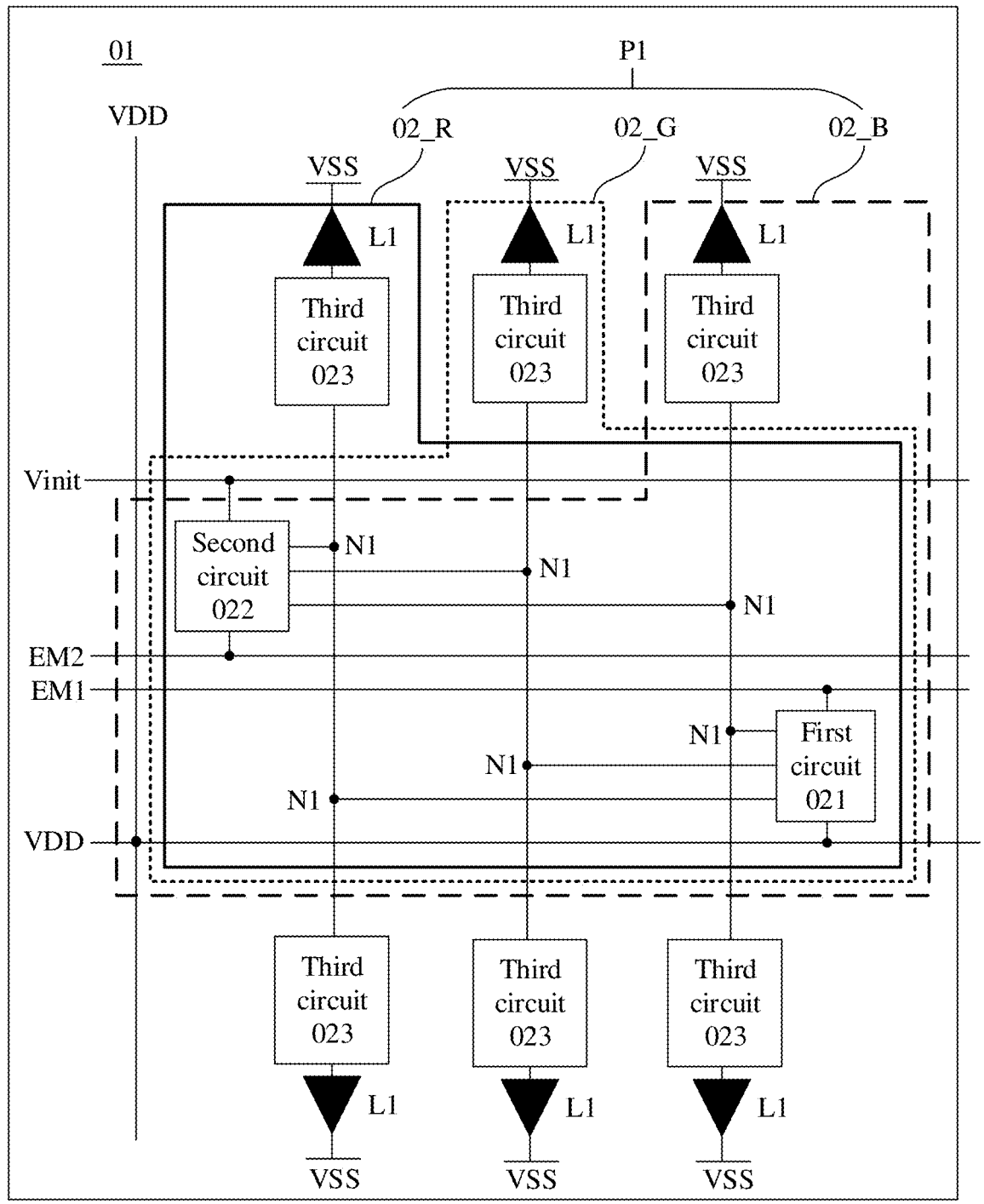
FIG. 5 is a schematic structural diagram of a plurality of subpixels in a display panel according to some embodiments of the present disclosure.

In some embodiments, in the embodiments of the present disclosure, referring to another display panel shown in FIG. 5, in the plurality of subpixels 02 in the display panel, at least two subpixels 02 in the same row share the target circuit. That is, the at least two subpixels 02 sharing the same target circuit are disposed in the same row, which can simplify the structure of a large number of subpixels 02 in the display panel and further facilitate the high-PPI design of the display panel.

It should be noted that the at least two subpixels 02 sharing the same target circuit are subpixels 02 in the same row only. That is, in the display panel, only at least two subpixels 02 in the same row share the target circuit. Alternatively, with reference to FIG. 5, the at least two subpixels 02 sharing the same target circuit include subpixels 02 in the same row and subpixels 02 in the same column. The embodiments of the present disclosure are illustrated by taking an example in which the at least two subpixels 02 sharing the same target circuit include the subpixels 02 in the same row and the subpixels 02 in the same column.

Figure 6:
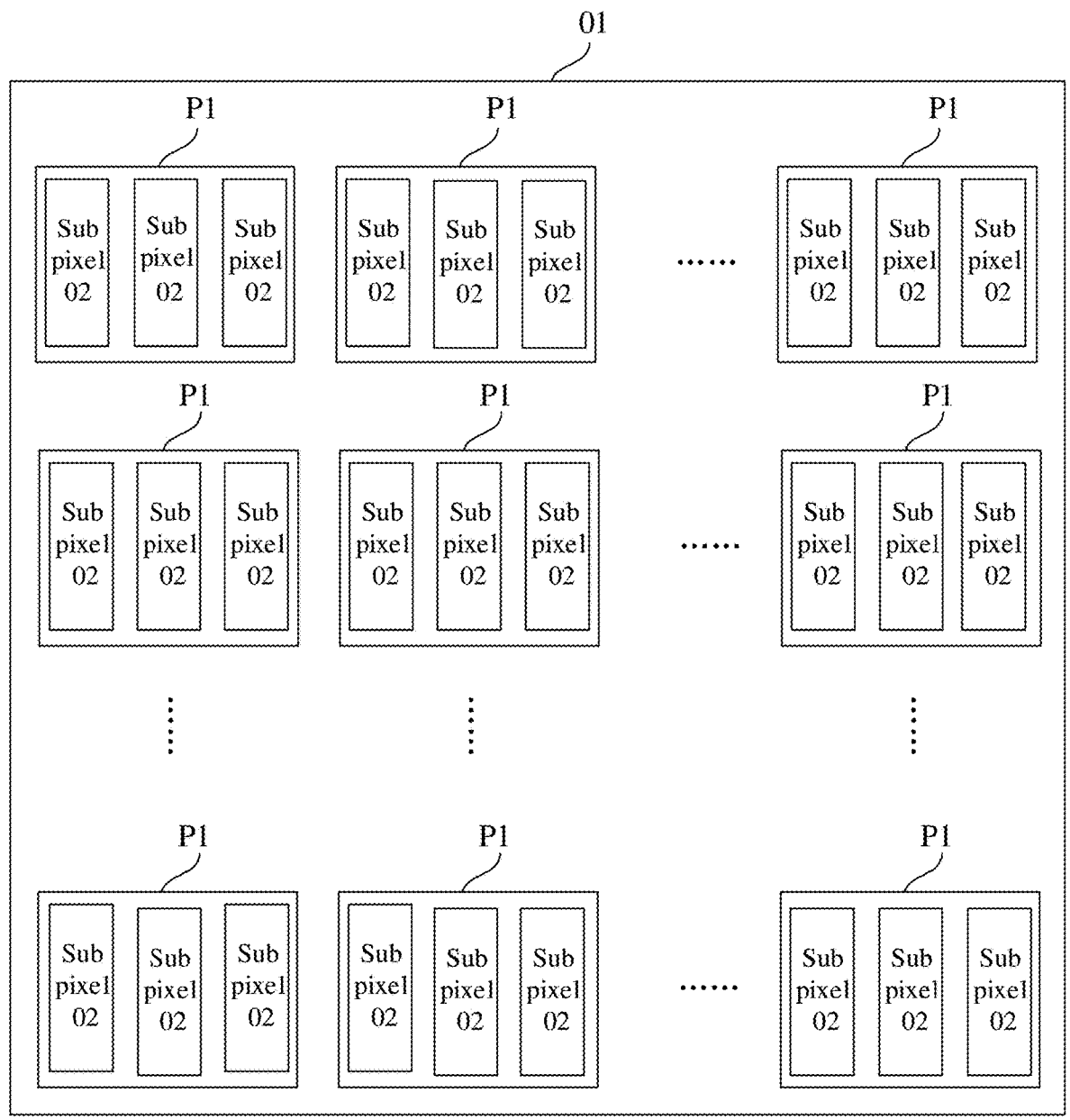
FIG. 6 is a schematic structural diagram of still another display panel according to some embodiments of the present disclosure.

In some embodiments, referring to another display panel shown in FIG. 6, the display panel provided in the embodiments of the present disclosure include a plurality of pixels P1 arranged in an array. Each pixel P1 includes at least two subpixels 02, and the at least two subpixels 02 are sequentially arranged in the row direction. That is, in the plurality of subpixels 02 in the display panel, two or more subpixels 02 arranged in the row direction constitute one pixel P1.

For example, each pixel P1 shown in FIG. 6 includes three subpixels 02. To ensure normal display of the display panel, colors of the three subpixels 02 in each pixel P1 are different. For example, the colors of the three subpixels 02 in each pixel P1 are red (R), green (G), and blue (B). That is, each pixel P1 includes subpixels 02 of three colors, namely, R, G, and B.

In some embodiments, with reference to FIG. 5, it can be seen that the at least two subpixels 02 sharing the target circuit and disposed in the same row belong to the same pixel P1. That is, for any row of subpixels 02, at least two subpixels 02 included in each pixel P1 share the same target circuit.

In some embodiments, in the embodiments of the present disclosure, all the subpixels 02 included in each pixel P1 share the target circuit, which can further facilitate the high-PPI design of the display panel.

For example, FIG. 5 shows a total of 6 subpixels 02 in two adjacent rows and three adjacent columns. The 3 subpixels 02 in the same row belong to the same pixel P1, and the 3 subpixels 02 are a red subpixel R, a green subpixel G, and a blue subpixel B, which are marked with 02_R, 02_G, and 02_B in the figure. FIG. 5 actually shows two pixels P1 in the same column and two adjacent rows (an odd row and an even row). The 3 subpixels 02 share the same second circuit 022 and the same first circuit 021. It can be seen from FIG. 5 that the two subpixels 02 in the same column and different rows further share the same second circuit 022 and the same first circuit 021, and correspondingly, further share the same first control line EM1 and the same second control line EM2.

It can be seen that the 6 subpixels 02 in two adjacent rows and different columns include 8 circuits in total, and after the 8 circuits are equally divided among the 6 subpixels 02, each subpixel 02 includes only 1.3 circuits. The number is significantly reduced in comparison with some practices in which each subpixel 02 includes 3 circuits. On this basis, it may be considered that in the display panel, in two pixels P1 in the same column and an odd row and an even row, three RGB subpixels included in one pixel P1 and three RGB subpixels included in the other pixel P1 share the target circuit and the target signal line.

Certainly, in some other embodiments, each pixel P1 alternatively includes 2, 4, or other number of subpixels 02, and each pixel P1 further includes a white (W) subpixel or a subpixel 02 of another color, which is not limited in the embodiments of the present disclosure.

In some other embodiments, the at least two subpixels 02 sharing the target circuit and disposed in the same row alternatively belong to different pixels P1. In the case that the at least two subpixels 02 sharing the same target circuit belong to different pixels P1, at least one subpixel 02 in each pixel P1 and at least one subpixel 02 in another pixel P1 share the same target circuit.

Figure 7:
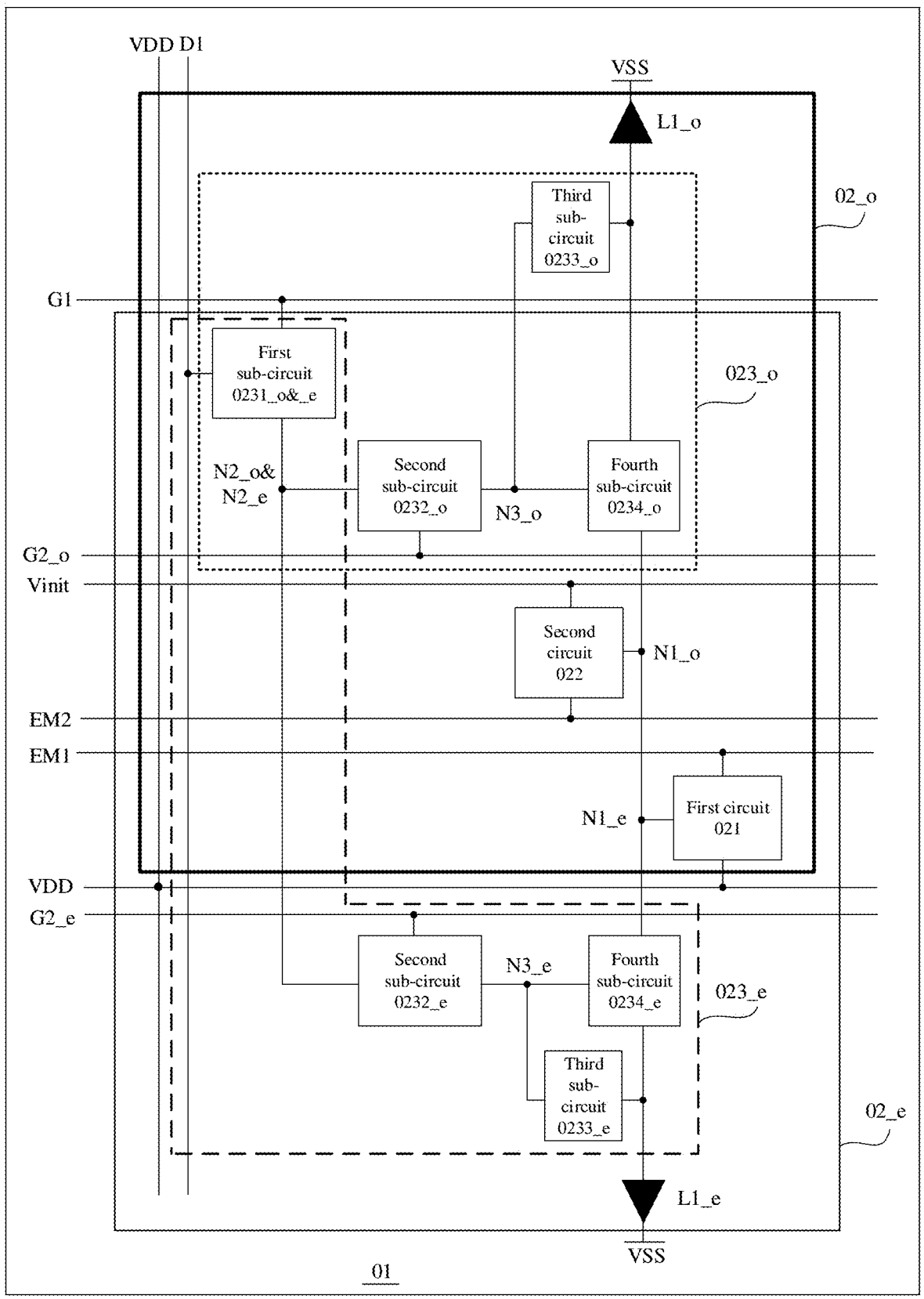
FIG. 7 is a schematic structural diagram of two subpixels in still another display panel according to some embodiments of the present disclosure.

FIG. 7 is a schematic structural diagram of another display panel according to some embodiments of the present disclosure. As shown in FIG. 7, the display panel further includes a plurality of third control lines G1, a plurality of fourth control lines G2, and a plurality of data lines D1 on a side of the substrate 01. The third circuit 023 includes a first sub-circuit 0231, a second sub-circuit 0232, a third sub-circuit 0233, and a fourth sub-circuit 0234.

The first sub-circuit 0231 is coupled to the third control line G1, the data line D1, and a second node N2. The first sub-circuit 0231 is configured to control, in response to a third control signal provided by the third control line G1, the data line D1 to be connected to or disconnected from the second node N2.

For example, the first sub-circuit 0231 controls the data line D1 to be connected to the second node N2 when a potential of the third control signal is the first potential. In this case, a data signal provided by the data line D1 is transmitted to the second node N2. The first sub-circuit 0231 controls the data line D1 to be disconnected from the second node N2 when the potential of the third control signal is the second potential.

The first sub-circuit 0231 is also referred to as a data writing sub-circuit, and the third control line G1 is also referred to as a first gate line. Correspondingly, the third control signal is also referred to as a first gate driving signal.

The second sub-circuit 0232 is coupled to the fourth control line G2, the second node N2, and a third node N3. The second sub-circuit 0232 is configured to control, in response to a fourth control signal provided by the fourth control line G2, the second node N2 to be connected to or disconnected from the third node N3.

For example, the second sub-circuit 0232 controls the second node N2 to be connected to the third node N3 when a potential of the fourth control signal is the first potential. In this case, the signal (for example, data signal) transmitted to the second node N2 is further transmitted to the third node N3. The second sub-circuit 0232 controls the second node N2 to be disconnected from the third node N3 when the potential of the fourth control signal is the second potential.

The second sub-circuit 0232 is also referred to as a second data writing sub-circuit, and the fourth control line G4 is also referred to as a second gate line. Correspondingly, the fourth control signal is also referred to as a second gate driving signal.

The third sub-circuit 0233 is coupled to the third node N3 and the light-emitting element L1. The third sub-circuit 0233 is configured to adjust the potential at the third node N3 and the potential of the light-emitting element L1. For example, the third sub-circuit 0233 adjusts the potential at the third node N3 and the potential of the light-emitting element L1 through a coupling effect. The third sub-circuit 0233 is referred to as an adjustment sub-circuit.

The fourth sub-circuit 0234 is coupled to the third node N3, the first node N1, and the light-emitting element L1. The fourth sub-circuit 0234 is configured to transmit a light emission driving signal (for example, driving current) to the light-emitting element L1 based on the potential at the first node N1 and the potential at the third node N3 to drive the light-emitting element L1 to emit light. The fourth sub-circuit 0234 is also referred to as a drive sub-circuit.

The shared target circuit described in the embodiments of the present disclosure further includes the first sub-circuit 0231. Specifically, the at least two subpixels 02 in the same column share the same first sub-circuit 0231. On this basis, with reference to the description of the foregoing embodiments, it can be seen that the at least two subpixels 02 in the same column further share the same second node N2 and the same third control line G1. That is, the target signal line further includes the third control line G1. This can further simplify the circuit structure of the subpixel 02 and reduce the number of signal lines that need to be disposed.

For example, FIG. 7 shows two subpixels 02 (marked with 02_e and 02_o) in the same column and an odd row and an even row. The two subpixels 02_e and 02_o not only share the same second circuit 022 and the same first circuit 021, but also share the same first sub-circuit 0231. Correspondingly, the two subpixels 02_e and 02_o share the same first control line EM1, the same second control line EM2, and the same third control line G1. Except the foregoing circuits and signal lines, reference numerals of circuits, signal lines, and nodes in the subpixel 02_e are added with "_e", and reference numerals of circuits, signal lines, and nodes in the subpixel 02_o are added with "_o" for distinguishing. The same is true for the reference numerals in the following embodiments, and details are not repeated again.

With reference to the function of the first sub-circuit 0231, it can be known that the least two subpixels 02 in the same column are configured to share the first sub-circuit 0231 such that a data signal provided by one data line D1 can be simultaneously transmitted to the second nodes N2 of the subpixels 02. Then, when the fourth control line G2 to which each subpixel 02 is coupled provides the fourth control signal at the first potential, each subpixel 02 further transmits the data signal received by the second node N2 thereof to the third node N3 thereof.

In this way, the third control signal provided by the third control line G1 can be flexibly controlled such that the data signal provided by the same data line D1 is transmitted to different subpixels 02 in the same column in a time-sharing manner. For example, in the case that every two subpixels 02 (regarded as one subpixel group Z1) in the plurality of subpixels 02 in the same column share the same first sub-circuit 0231, every two subpixel groups Z1 include different first sub-circuits 0231. On this basis, the third control signals provided by the third control lines G1 to which the first sub-circuits 0231 are coupled can be flexibly controlled such that the same data line D1 is connected to the second nodes N2 of the subpixel groups Z1 simultaneously or in a time-sharing manner. In this way, partitioned displayed can be achieved, and the partition is referred to as a column-direction partition. The third control line G1 is considered as a column-direction partition control switch, and is configured to control a partition to emit light only without data refreshing in one frame of scanning such that data bandwidth of the data line D1 is not occupied, thereby providing a high-frequency refreshing drive function for a high-resolution partition (a region obtained through manual division).

Figure 8:
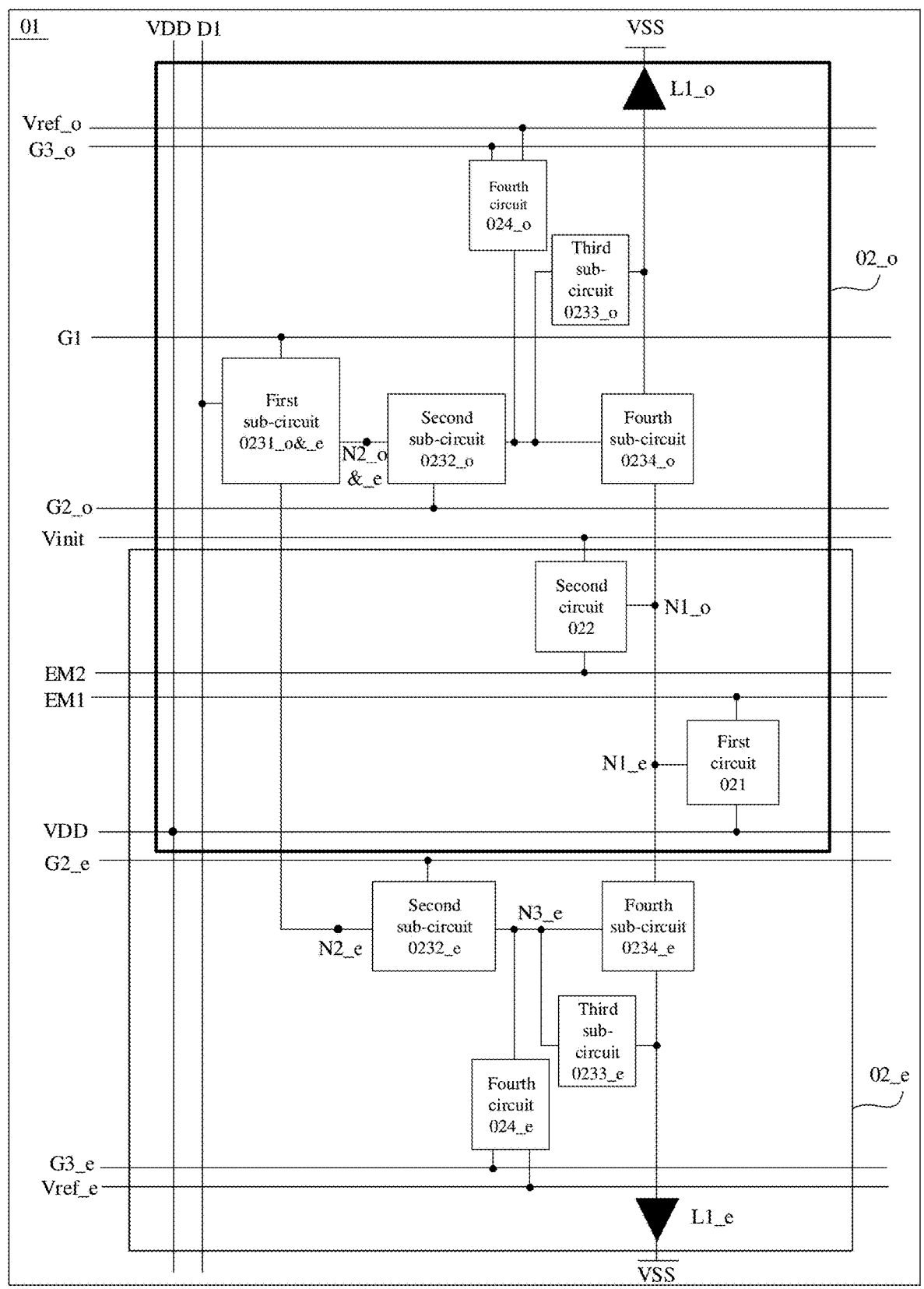
FIG. 8 is a schematic structural diagram of two subpixels in yet another display panel according to some embodiments of the present disclosure.

FIG. 8 is a schematic structural diagram of yet another display panel according to some embodiments of the present disclosure. As shown in FIG. 8, the display panel further includes a plurality of fifth control lines G3 and a plurality of third power lines Vref on a side of the substrate 01, and each subpixel 02 further includes a fourth circuit 024.

The fourth circuit 024 is coupled to the fifth control line G3, the third power line Vref, and the third node N3. The fourth circuit 024 is configured to control, in response to a fifth control signal provided by the fifth control line G3, the third power line Vref to be connected to or disconnected from the third node N3.

For example, the fourth circuit 024 controls the third power line Vref to be connected to the third node N3 when a potential of the fifth control signal is the first potential. In this case, a third power signal provided by the third power line Vref is transmitted to the third node N3 to reset the third node N3. The fourth circuit 024 controls the third power line Vref to be disconnected from the third node N3 when the potential of the fifth control signal is the second potential.

The fourth circuit 024 is also referred to as a second reset circuit, and the fifth control line G3 is also referred to as a third gate line G3. Correspondingly, the fifth control signal is also referred to as a third gate driving signal. The third power line Vref is also referred to as a reset power line. Correspondingly, the third power signal is also referred to as a reset power signal.

Figure 9:
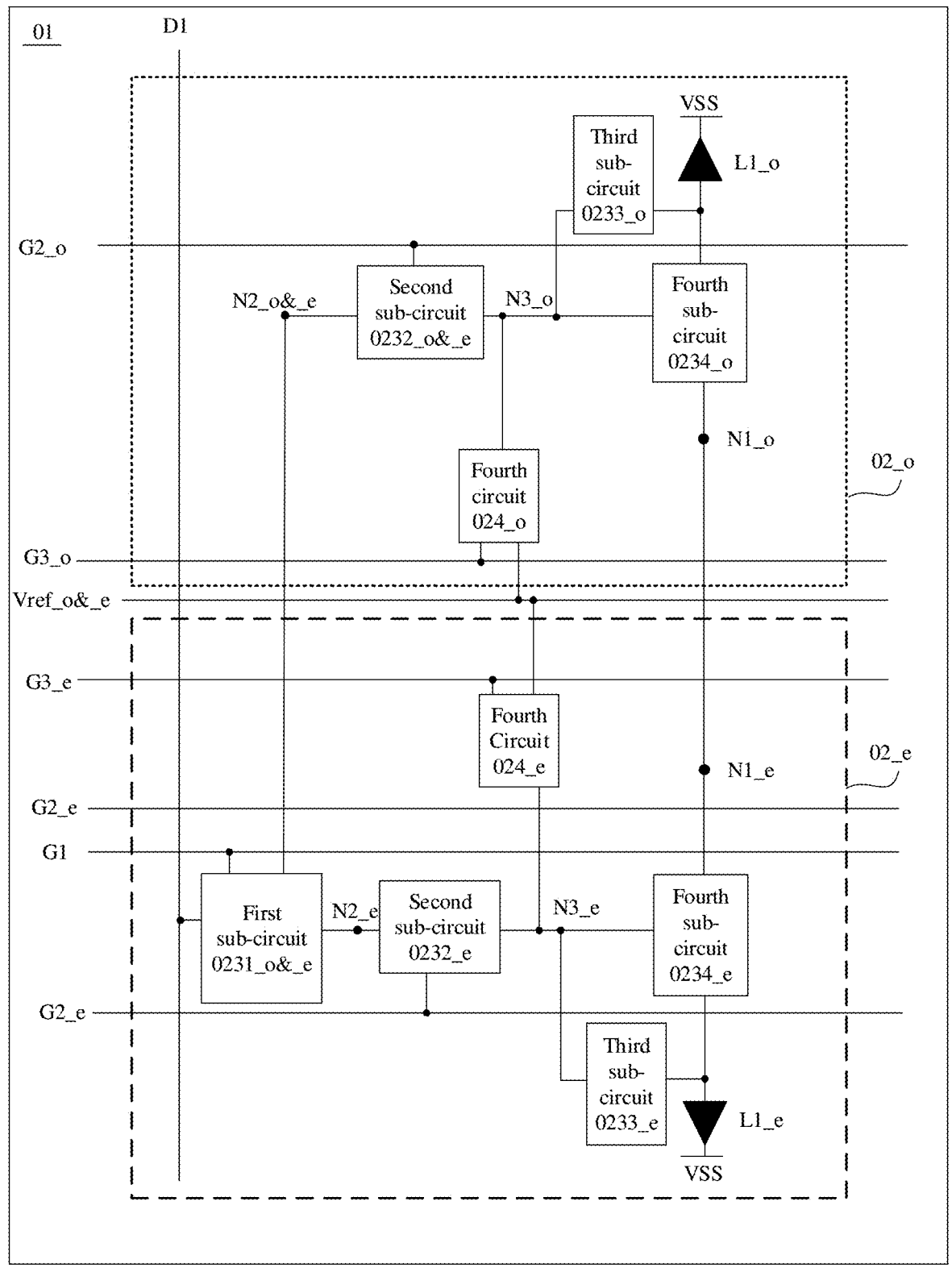
FIG. 9 is a schematic structural diagram of two subpixels in yet another display panel according to some embodiments of the present disclosure.

In some embodiments, referring to FIG. 9, in the embodiments of the present disclosure, the at least two subpixels 02 in the same column further share the same third power line Vref. That is, the target signal line further includes the third power line Vref, which can further reduce the number of signal lines that need to be disposed in the display panel. FIG. 9 does not show the first circuit 021 and the second circuit 022, and the signal lines to which these two circuits are coupled.

It should be noted that both FIG. 8 and FIG. 9 show a display panel based on the structure shown in FIG. 7. That is, FIG. 8 and FIG. 9 merely schematically show the two subpixels 02_e and 02_o in the same column and the odd row and the even row. In FIG. 8, because the two subpixels 02_e and 02_o do not share the third power line Vref, the third power line Vref to which the subpixel 02_e in the odd row is coupled is marked with Vref_e, and the third power line Vref to which the subpixel 02_o in the even row is coupled is marked with Vref_o. In FIG. 9, the two adjacent subpixels 02 in the same column share the same third power line Vref.

Figure 10:
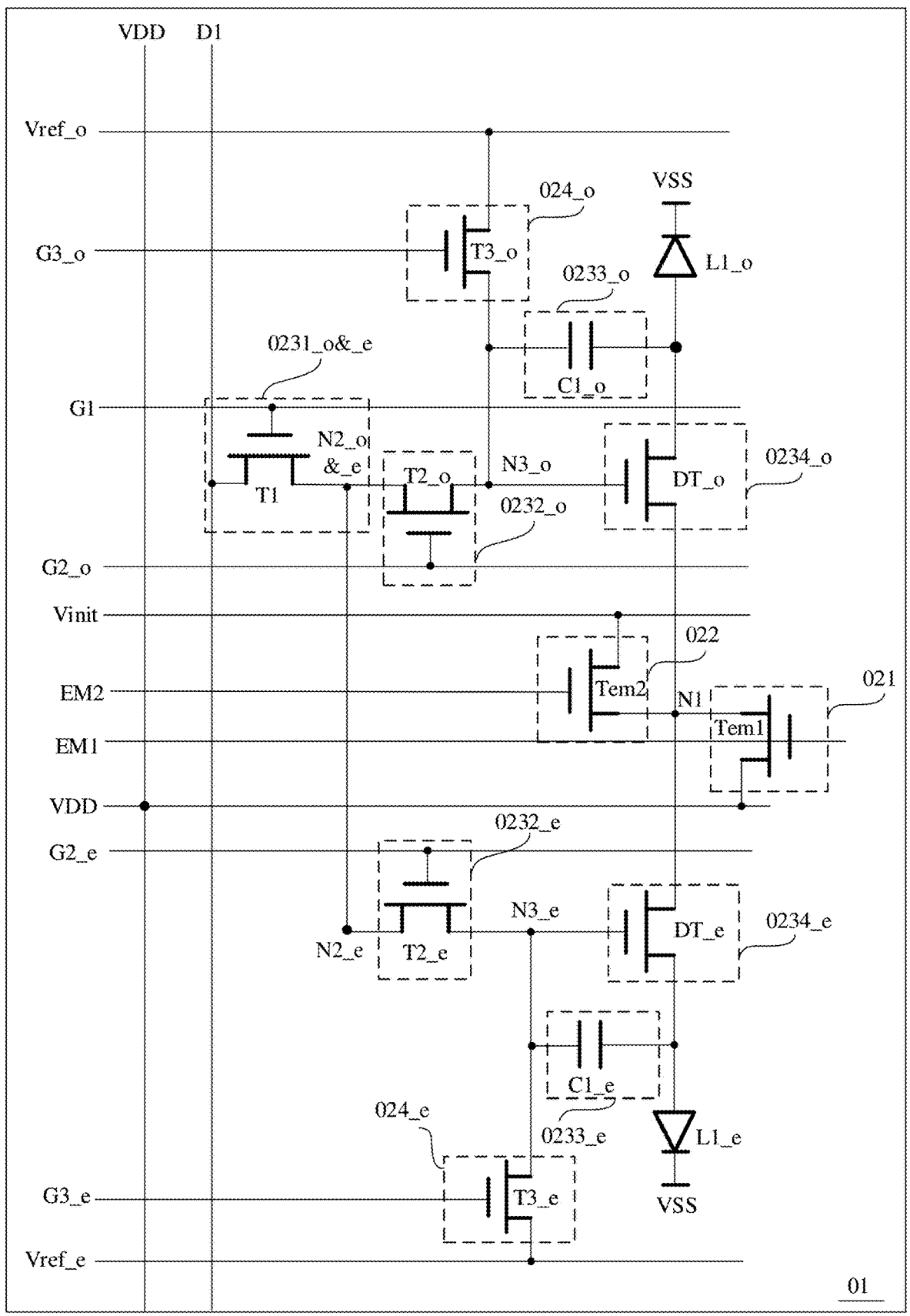
FIG. 10 is a schematic structural diagram of two subpixels in yet another display panel according to some embodiments of the present disclosure.

Taking the structure shown in FIG. 8 as an example, FIG. 10 is a schematic structural diagram of yet another display panel. As shown in FIG. 10, the first circuit 021 includes a first transistor Tem1 (which is also referred to as a first reset transistor). The second circuit 022 includes a second transistor Tem2 (which is also referred to as a light emission control transistor). The first sub-circuit 0231 includes a third transistor T1 (which is also referred to as a first data writing transistor). The second sub-circuit 0232 includes a fourth transistor T2 (which is also referred to as a second data writing transistor). The third sub-circuit 0233 includes a storage capacitor C1. The fourth sub-circuit 0234 includes a fifth transistor DT (which is also referred to as a driving transistor). The fourth circuit 024 includes a sixth transistor T3 (which is also referred to as a second reset transistor).

A gate of the first transistor Tem1 is coupled to the first control line EM1, a first electrode of the first transistor Tem1 is coupled to the first power line VDD, and a second electrode of the first transistor Tem1 is coupled to the first node N1.

A gate of the second transistor Tem2 is coupled to the second control line EM2, a first electrode of the second transistor Tem2 is coupled to the second power line Vinit, and a second electrode of the second transistor Tem2 is coupled to the first node N1.

A gate of the third transistor T1 is coupled to the third control line G1, a first electrode of the third transistor T1 is coupled to the data line D1, and a second electrode of the third transistor T1 is coupled to the second node N2.

A gate of the fourth transistor T2 is coupled to the fourth control line G2, a first electrode of the fourth transistor T2 is coupled to the second node N2, and a second electrode of the fourth transistor T2 is coupled to the third node N3.

A first terminal of the storage capacitor C1 is coupled to the third node N3 and a second terminal of the storage capacitor C1 is coupled to the light-emitting element L1.

A gate of the fifth transistor DT is coupled to the third node N3, a first electrode of the fifth transistor DT is coupled to the first node N1, and a second electrode of the fifth transistor DT is coupled to the light-emitting element L1. In some embodiments, with reference to the description of the foregoing embodiments, and referring to FIG. 10, the second electrode of the fifth transistor DT is coupled to the anode of the light-emitting element L1, and the cathode of the light-emitting element L1 is further coupled to the pull-down power line VSS.

A gate of the sixth transistor T3 is coupled to the fifth control line G3, a first electrode of the sixth transistor T3 is coupled to the third power line Vref, and a second electrode of the sixth transistor T3 is coupled to the third node N3.

It should be noted that in FIG. 10, referring to the reference numerals in FIG. 7, reference numerals of circuits, signal lines, and nodes in the subpixel 02_e are added with "_e", and reference numerals of circuits, signal lines, and nodes in the subpixel 02_o added with "_o" to distinguish between the two subpixels 02_e and 02_o. Referring to FIG. 10, it can be seen that the two subpixels 02_e and 02_o in the same column and the odd row and the even row share the same first transistor Tem1, the same second transistor Tem2, and the same third transistor T1, and correspondingly, share the same first control line EM1, the same second control line EM2, the same second power line Vinit, and the same third control line G1.

On this basis, the two subpixels 02 include 9 transistors in total. After the 9 transistors are equally divided among the two subpixels 02, each subpixel 02 includes only 4.5 transistors. That is, the subpixel provided in the embodiments of the present disclosure has a 4.5T1C structure (including 4.5 transistors and 1 capacitor). If the transistors are not shared, each of the two subpixels 02 needs to include 6 transistors and 1 capacitor. That is, the subpixel in some practices generally has a 6T1C structure. Therefore, in the embodiments of the present disclosure, the 6T1C structure is simplified into the 4.5T1C structure to reliably facilitate the high-PPI design of the display panel.

In some embodiments, the transistors included in each subpixel 02 are N-type transistors, and the material of the N-type transistors includes low temperature polysilicon (LTPS). That is, the pixel circuit included in the subpixel 02 is an LTPS N-type pixel circuit. Certainly, in some other embodiments, the transistors included in each subpixel 02 are alternatively P-type transistors; or some of the transistors are P-type transistors and the other transistors are N-type transistors. The material of the N-type transistors is not limited to LTPS, and may alternatively be oxide. For the N-type transistor, the first potential is a high potential relative to the second potential. For the P-type transistor, the first potential is a low potential relative to the second potential.

It should be noted that the foregoing merely schematically illustrates an optional structure of the subpixel 02, i.e., the 4.5T1C (4.5 transistors and 1 capacitor) structure. Certainly, the structure of the subpixel 02 is not limited in the embodiments of the present disclosure, and may alternatively be other structures.

Figure 11:
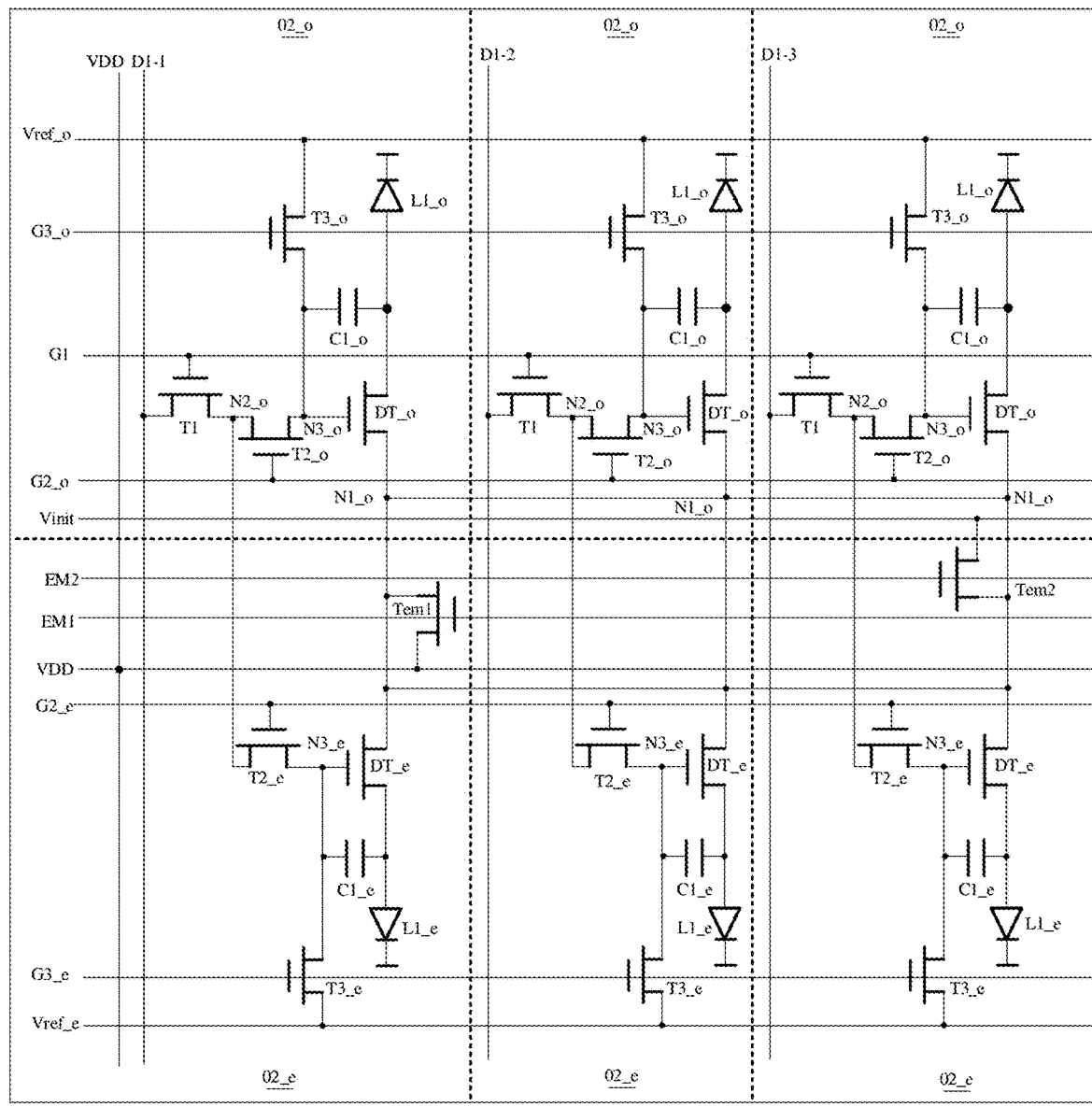
FIG. 11 is a schematic structural diagram of a plurality of subpixels in another display panel according to some embodiments of the present disclosure.

Taking the structures shown in FIG. 5 and FIG. 10 as an example, FIG. 11 is a schematic structural diagram of yet another display panel. FIG. 11 shows a total of 2 pixels P1 in adjacent odd and even rows, and a total of 6 subpixels 02. Referring to FIG. 11, it can be seen that the 6 subpixels 02 share the same first transistor Tem1 and the same second transistor Tem2. In FIG. 10, the data lines D1 to which the 3 columns of subpixels 02 are coupled are marked with D1-1, D1-2, and D1-3 to distinguish between the data lines D1.

Figure 12:
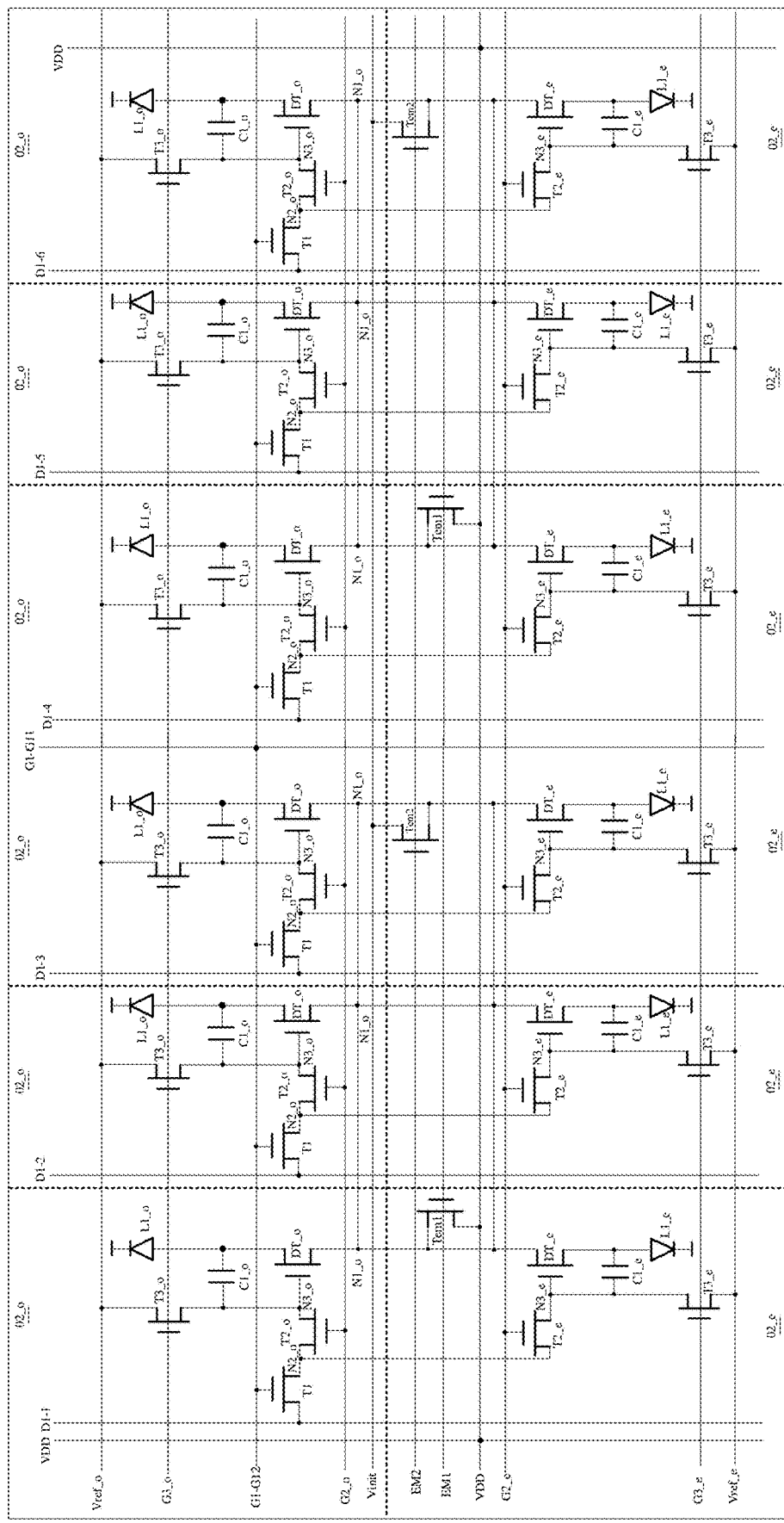
FIG. 12 is a schematic structural diagram of a plurality of subpixels in still another display panel according to some embodiments of the present disclosure.

Taking the structure shown in FIG. 11 as an example, FIG. 12 is a schematic structural diagram of yet another display panel. FIG. 12 shows a total of 4 pixels P1 in adjacent odd and even rows, and a total of 12 subpixels. In the 4 pixels P1, the 6 subpixels 02 included in every 2 pixels P1 in the same column and adjacent rows share the same first transistor Tem1 and the same second transistor Tem2. In FIG. 12, the data lines D1 to which the 6 columns of subpixels 02 are coupled are marked with D1-1, D1-2, D1-3, D1-4, D1-5, and D1-6 to distinguish between the data lines D1.

Figure 13:
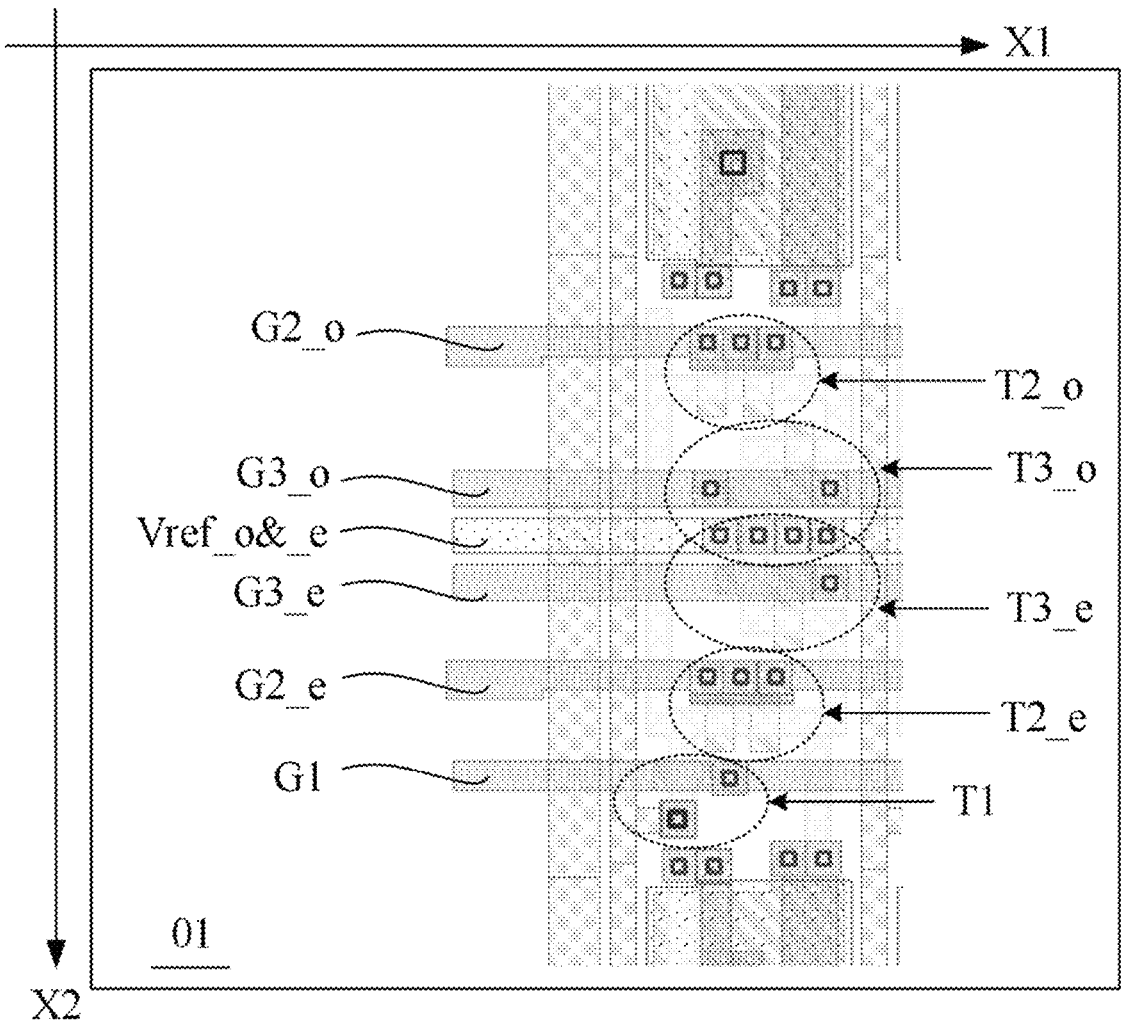
FIG. 13 is a diagram of a partial structural layout of a display panel according to some embodiments of the present disclosure.

With reference to the structure shown in FIG. 9, FIG. 13 is an enlarged view of a partial structure of a display panel on the basis of sharing the third power line Vref. Referring to FIG. 13, it can be seen that the third power line Vref extends in a first direction X1. In the plurality of subpixels 02, the fourth control lines G2 and the fifth control lines G3 to which two subpixels 02 disposed in two adjacent rows and sharing the third power line Vref are coupled all extend in the first direction X1, are sequentially arranged close to the third power line Vref in a second direction X2, and are respectively distributed on two sides of the third power line Vref.

The second sub-circuits 0232 included in the two subpixels 02 in two adjacent rows are distributed on two sides of the third power line Vref. The fourth circuits 024 included in the two subpixels 02 in two adjacent rows are distributed on two sides of the third power line Vref. The second sub-circuit 0232 and the fourth circuit 024 are sequentially arranged in a direction close to the third power line Vref.

The first direction X1 intersects the second direction X2, that is, the first direction X1 is not parallel to the second direction X2. For example, referring to FIG. 12, the first direction X1 is perpendicular to the second direction X2. With reference to the description of the foregoing embodiments, the first direction X1 is the subpixel row direction, and the second direction X2 is the subpixel column direction.

The arrangement design shown in FIG. 13 also facilitates the layout and signal routing such that the signal lines can be arranged in a concentrated manner to further optimize the space. In the following description, an example in which the third power line Vref is not shared is used.

Figure 14:
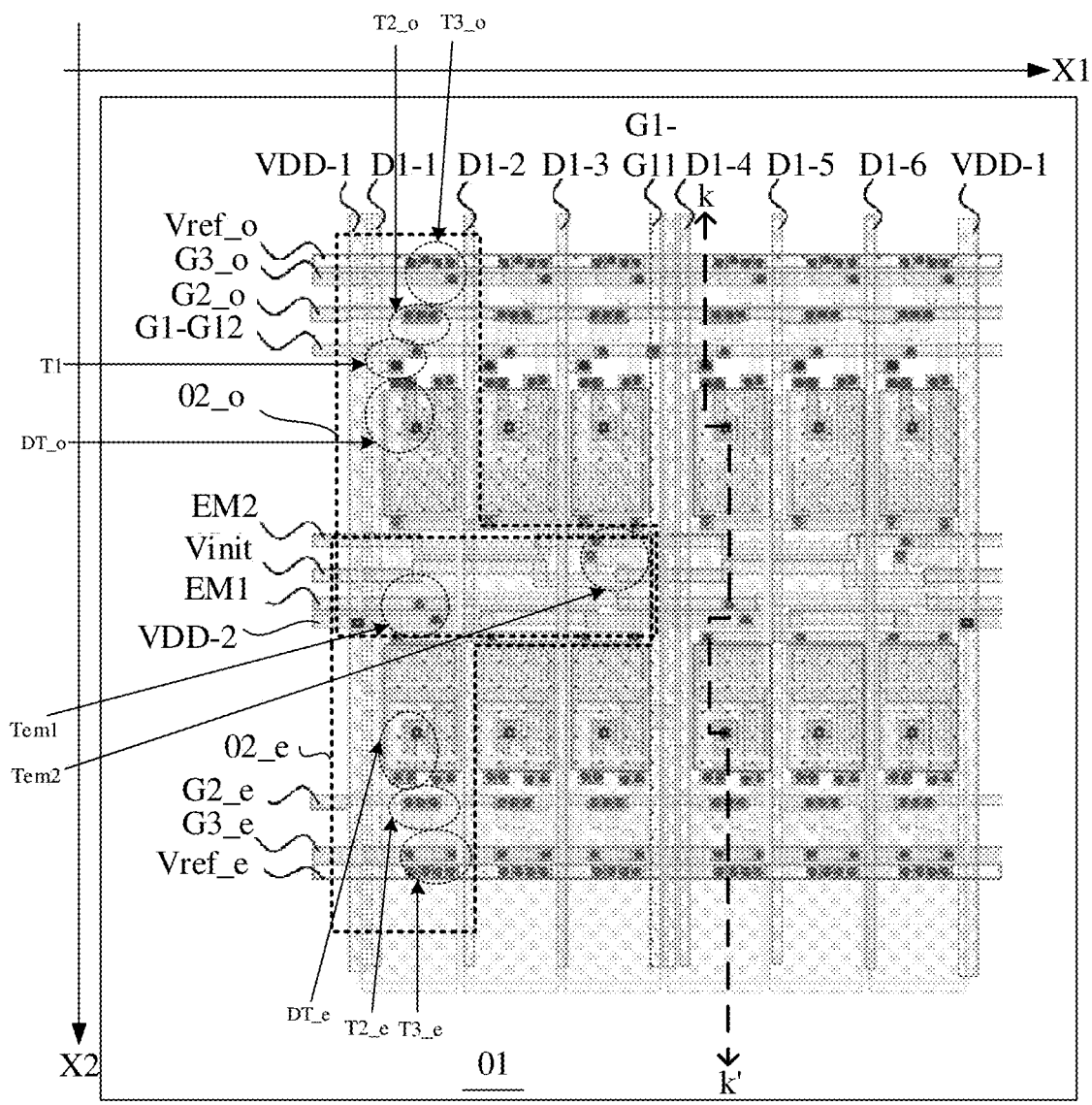
FIG. 14 is a diagram of a partial structural layout of another display panel according to some embodiments of the present disclosure.
Figure 15:
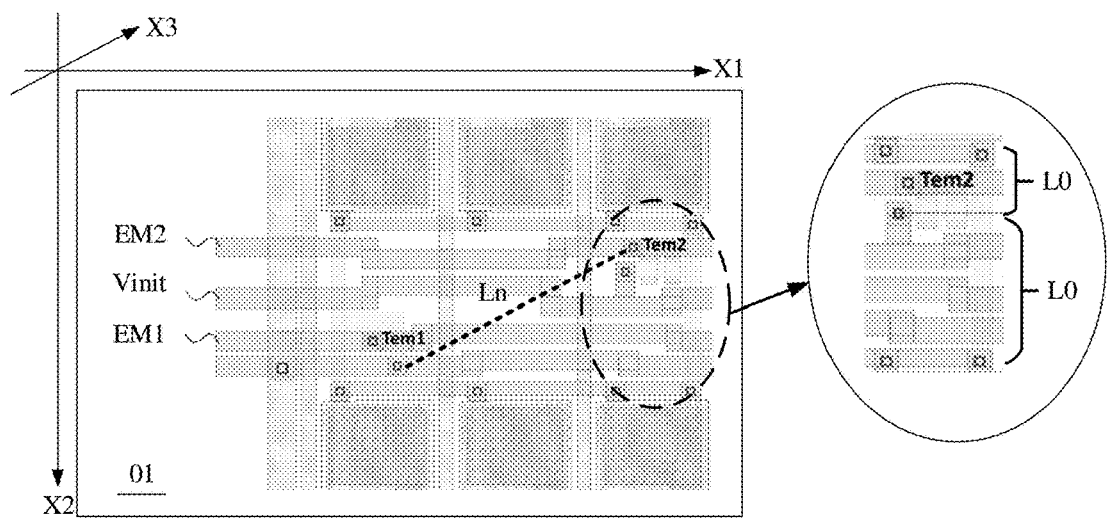
FIG. 15 is a partial enlarged schematic diagram of the structural layout shown in FIG. 14.

In an optional implementation, FIG. 14 shows a structural layout of another display panel by taking the structures shown in FIG. 10 and FIG. 11 as an example. FIG. 15 is a partial enlarged view of FIG. 14. As can be seen from FIG. 14, in the display panel, the second control line EM2, the second power line Vinit, and the first control line EM1 all extend in the first direction X1 and are sequentially arranged in the second direction X2. The first control line EM1 and the second control line EM2 are distributed on different sides of the second power line Vinit. The second control line EM2 and the first control line EM1 are not equidistant from the second power line Vinit in the second direction X2.

It should be noted that in the embodiments of the present disclosure, A and B being arranged or distributed on different sides (i.e., two sides) of C refers to that A and B are disposed on different sides of C on the substrate 01, for example, upper and lower sides shown in the figure. Certainly, in some other embodiments, A and B being arranged on two sides of C alternatively refers to that A and B are symmetrically arranged on two sides of C. The symmetrical arrangement may be understood as that A and B overlap with each other after being folded with C as an axis of symmetry. A, B, and C are merely used to represent different structures, but are not identifiers of specific structures. For example, for the case that the second control line EM2 and the first control line EM1 are arranged on two sides of the second power line Vinit, A is used to represent the second control line EM2, B is used to represent the first control line EM1, and C is used to represent the second power line Vinit. Correspondingly, with reference to the accompanying drawings, the second control line EM2 and the first control line EM1 being distributed on two sides of the second power line Vinit refers to that the second control line EM2 and the first control line EM1 are disposed on upper and lower sides of the second power line Vinit on the substrate 01.

In the plurality of subpixels 02, two subpixels 02 disposed in two adjacent rows and sharing the first circuit 021, the second circuit 022, the first sub-circuit 0231, the first control line EM1, the second control line EM2, and the third control line G1 are arranged on two sides of the second power line Vinit. The third power lines Vref, the fifth control lines G3, and the fourth control lines G2 to which the two subpixels 02 in the two adjacent rows are coupled all extend in the first direction X1, are sequentially arranged close to the second power line Vinit in the second direction X2, and are respectively arranged on the two sides of the second power line Vinit.

On this basis, still referring to FIG. 14, the third control lines G1 to which the two subpixels 02 in the two adjacent rows are coupled each include a first portion G11 and a second portion G12, and the first power line VDD includes a first portion VDD-1 and a second portion VDD-2. The first portion G11 of the third control line G1 and the first portion VDD-1 of the first power line VDD are sequentially arranged in the first direction X1 and extend in the second direction X2. The second portion G12 of the third control line G1 and the second portion VDD-2 of the first power line VDD are sequentially arranged in the second direction X2 and extend in the first direction X1. The second portion G12 of the third control line G1 is disposed on the side of the second control line EM2 away from the second power line Vinit, and the second portion VDD-2 of the first power line VDD is disposed on the side of the first control line EM1 away from the second power line Vinit. The data lines D1 to which the two subpixels 02 in the two adjacent rows are coupled extend in the second direction X2, are sequentially arranged in the first direction X1, and are disposed between the first portion G11 of the third control line G1 and the first portion VDD-1 of the first power line VDD.

As can be seen from the partial enlarged view in FIG. 15, the second transistor Tem2 shared by the two subpixels 02 is generally coupled to the second power line Vinit through a via hole. In addition, based on the layout in FIG. 14, in the second direction X2, distances L0 from the via hole through which the second transistor Tem2 is coupled to the second power line Vinit to the two subpixels 02 are generally not equal.

Figure 16:
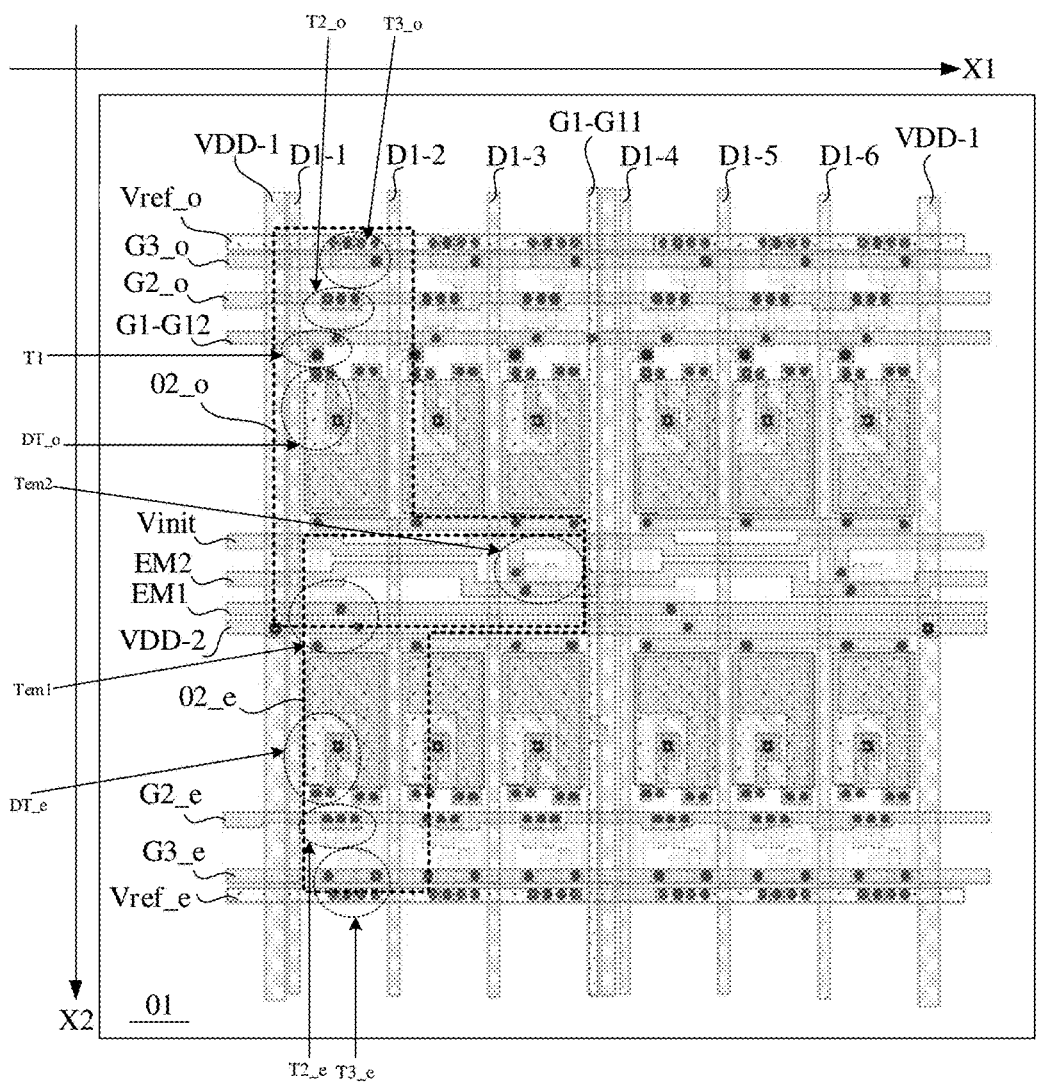
FIG. 16 is a diagram of a partial structural layout of still another display panel according to some embodiments of the present disclosure.
Figure 17:
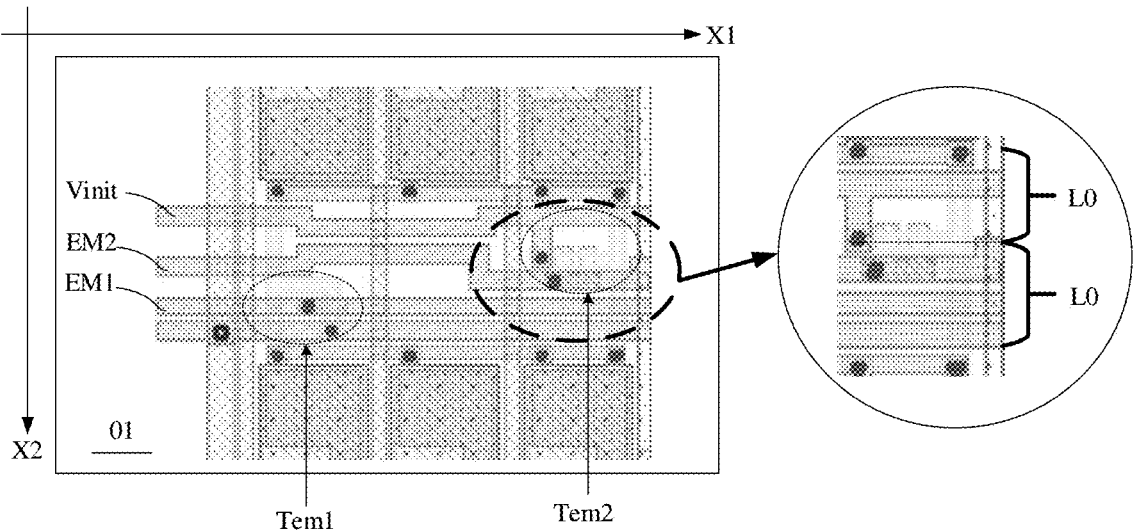
FIG. 17 is a partial enlarged schematic diagram of the structural layout shown in FIG. 15.

In another optional implementation, FIG. 16 shows a structural layout of another display panel by taking the structures shown in FIG. 10 and FIG. 11 as an example. FIG. 17 is a partial enlarged view of FIG. 16. As can be seen from FIG. 16, the second power line Vinit, the second control line EM2, and the first control line EM1 all extend in the first direction X1, and are sequentially arranged in the second direction X2. The first control line EM1 and the second control line EM2 are disposed on the same side of the second power line Vinit, and the first control line EM1 and the second power line Vinit are not equidistant from the second control line EM2 in the second direction X2. In other words, the second power line Vinit and the first control line EM1 are distributed on two sides (for example, upper and lower sides in the figure) of the second control line EM2.

In the plurality of subpixels 02, two subpixels 02 disposed in two adjacent rows and sharing the first circuit 021, the second circuit 022, the first sub-circuit 0231, the first control line EM1, the second control line EM2, and the third control line G1 are arranged on two sides of the second control line EM2. The third power lines Vref, the fifth control lines G3, and the fourth control lines G2 to which the two subpixels 02 in the two adjacent rows are coupled all extend in the first direction X1, are sequentially arranged close to the second control line EM2 in the second direction X2, and are respectively arranged on two sides of the second control line EM2.

On this basis, still referring to FIG. 16, the third control lines G1 to which the two subpixels 02 in the two adjacent rows are coupled each include a first portion G11 and a second portion G12, and the first power line VDD includes a first portion VDD-1 and a second portion VDD-2. The first portion G11 of the third control line G1 and the first portion VDD-1 of the first power line VDD are sequentially arranged in the first direction X1 and extend in the second direction X2. The second portion G12 of the third control line G1 and the second portion VDD-2 of the first power line VDD are sequentially arranged in the second direction X2 and extend in the first direction X1. The second portion G12 of the third control line G1 is disposed on the side of the second power line Vinit away from the second control line EM2, and the second portion VDD-2 of the first power line VDD is disposed on the side of the first control line EM1 away from the second control line EM2. The data lines D1 to which the two subpixels 02 in the two adjacent rows are coupled extend in the second direction X2, are sequentially arranged in the first direction X1, and are disposed between the first portion G11 of the third control line G1 and the first portion VDD-1 of the first power line VDD.

As can be seen from the partial enlarged view in FIG. 17, based on the layout in FIG. 16, in the second direction X2, the distances L0 from the via hole through which the second transistor Tem2 is coupled to the second power line Vinit to the two subpixels 02 are approximately equal. Being approximately equal refers to that a ratio of the distance L0 from the via hole to one of the subpixels 02 to the distance L0 from the via hole to the other subpixel 02 ranges from 0.9 to 1.1. In this way, signals transmitted to the two subpixels 02 are as same as possible, that is, the signals transmitted to the two subpixels 02 have good uniformity such that the display luminance of the two subpixels 02 has good uniformity and the display effect of the display panel can be improved.

No matter whether the arrangement shown in FIG. 14 or FIG. 16 is used, the layout and signal routing can be facilitated such that the signal lines can be arranged in a concentrated manner to further optimize the space.

As can be seen from FIG. 10 and FIG. 14 to FIG. 17, the first circuit 021 and the second circuit 022 shared by the two subpixels 02 in the two adjacent rows are sequentially arranged in a third direction X3 (as shown in FIG. 15), and the first circuit 021 and the second circuit 022 are not equidistant from the same subpixel 02 in the two subpixels 02 in the two adjacent rows. The third direction X3 intersects (that is, is not perpendicular to) the first direction X1 and the second direction X2. In other words, in the second direction X2, the first circuit 021 and the second circuit 022 shared by at least two subpixels 02 in the same column are arranged at two ends of a diagonal line. As shown in the partial enlarged view in FIG. 15 and of FIG. 17, the first circuit 021 and the second circuit 022 are disposed opposite to each other at two ends of a diagonal line Ln extending in the third direction X3, which can also facilitate the layout and signal routing, and further optimize the space.

In addition, it should be noted that the first circuit 021 and the second circuit 022 are not limited to being arranged at the two ends of the diagonal line as mentioned in the foregoing embodiments, that is, may be flexibly set as required. For example, the first circuit 021 and the second circuit 022 are sequentially arranged in the row direction, that is, disposed in the same row. Alternatively, the first circuit 021 and the second circuit 022 are sequentially arranged in the column direction, that is, disposed in the same column. In addition, the positions of the first circuit 021 and the second circuit 022 relative to the subpixel 02 may be flexibly adjusted based on actual conditions, and may be close to any subpixel 02 in a pixel P1, which is not specifically limited in the embodiments of the present disclosure.

Figure 18:
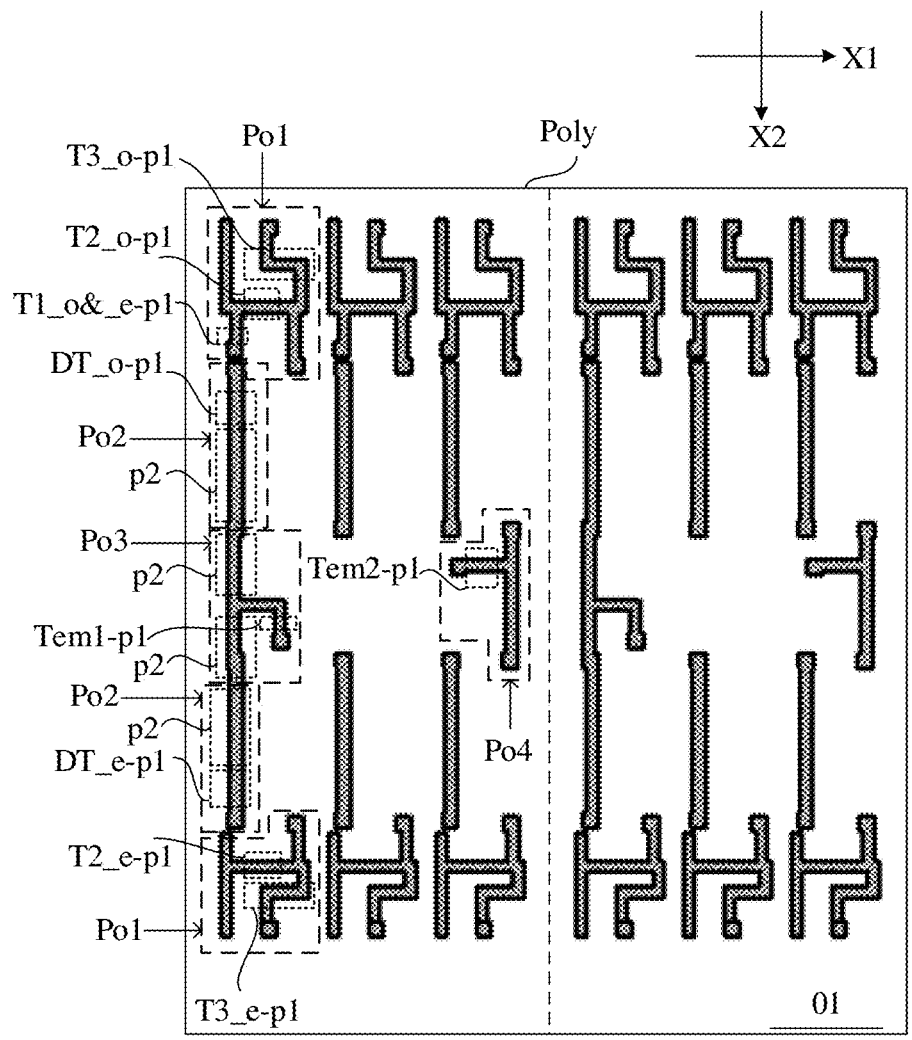
FIG. 18 is a diagram of a structural layout of some film layers in a display panel according to some embodiments of the present disclosure.
Figure 19:
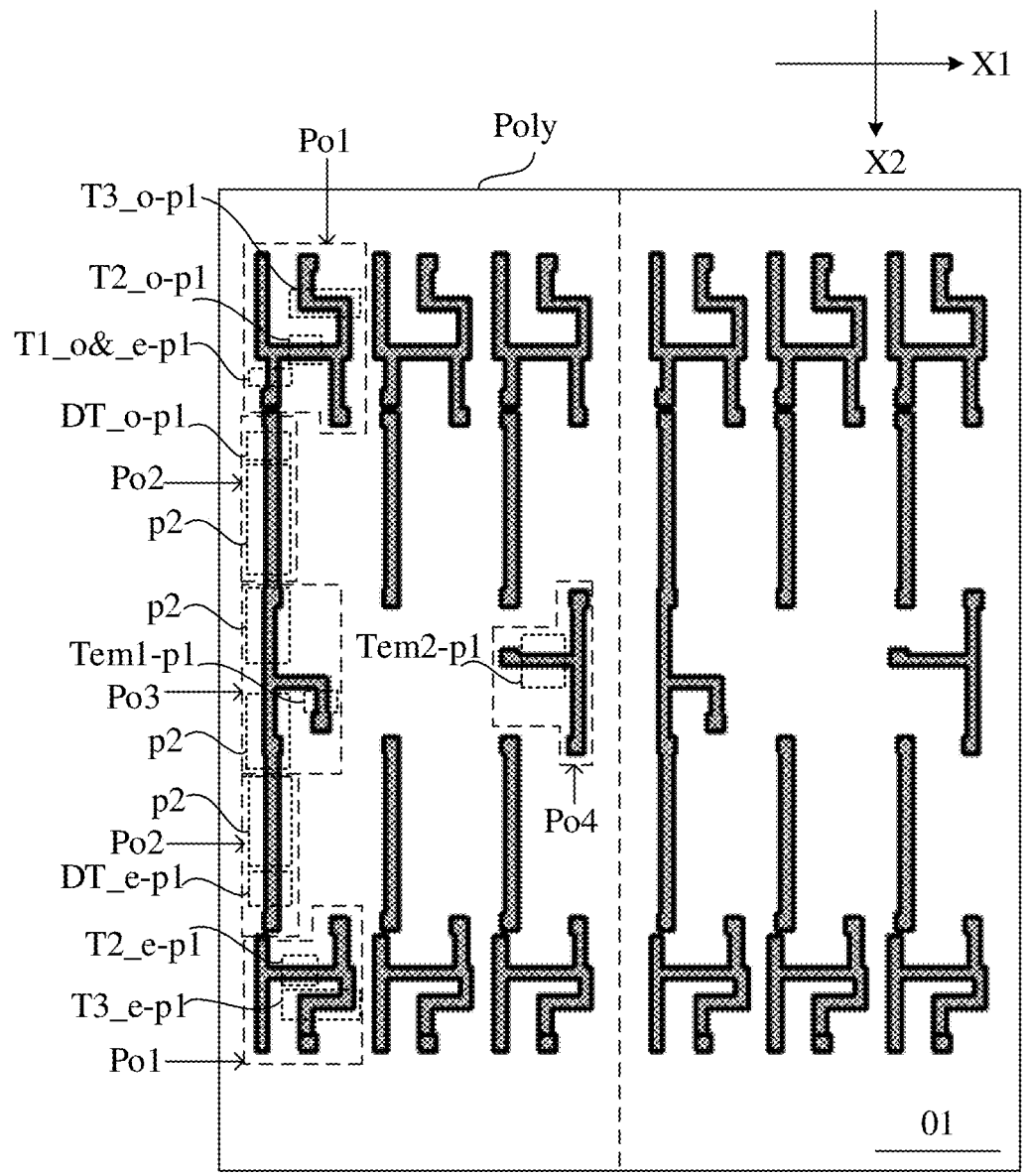
FIG. 19 is a diagram of a structural layout of some film layers in another display panel according to some embodiments of the present disclosure.

In some embodiments, taking the structure shown in FIG. 14 as an example, FIG. 18 shows a structural layout of yet another display panel. Taking the structure shown in FIG. 16 as an example, FIG. 19 shows a structural layout of yet another display panel. Referring to FIG. 18 and FIG. 19, the display panel provided in the embodiments of the present disclosure further includes an active layer Poly disposed between the substrate 01 and the light-emitting element 01. The active layer Poly includes active regions p1 of the transistors in the subpixels.

For one subpixel 02, the active layer Poly of the subpixel 02 includes a first portion Po1 and a second portion Po2 arranged at intervals in the second direction X2. The first portion Po1 includes an active region T3-p1 of the sixth transistor T3 and an active region T2-p1 of the fourth transistor T2 in the subpixel 02. The second portion Po2 includes an active region DT-p1 of the fifth transistor DT.

In the two subpixels 02 in the two adjacent rows, the first portion Po1 of the active layer Poly of one subpixel 02 further includes an active region T1-p1 of the shared third transistor T1.

The active layer Poly of the two subpixels 02 in the two adjacent rows further includes a third portion Po3 and a fourth portion Po4 that are arranged at intervals in the first direction X1 and are shared. The third portion Po3 includes an active region Tem1-p1 of the shared first transistor Tem1. The fourth portion Po4 includes an active region Tem2-p1 of the shared second transistor Tem2. The third portion Po3 and the second portion Po2 of the active layer Poly of each subpixel 02 are integrated, that is, are integrally formed.

The first portion Po1, the second portion Po2, the third portion Po3, and the fourth portion Po4 of the active layer Poly each further includes a conducting region p2. An orthographic projection of the conducting region p2 on the substrate 01 does not overlap an orthographic projection of the active region p1 on the substrate 01. The conducting region p2 of the second portion Po2 and the conducting region p2 of the third portion Po3 are configured to couple the two subpixels 02 in the two adjacent rows.

It should be noted that in FIG. 18 and FIG. 19, reference numerals of the active regions p1 of different subpixels 02 are added with _o and _e for distinguishing. The same is true for the reference numerals of other film layers hereinafter, and details are not described again.

The active region is also referred to as a channel region. The conducting region p2 includes a source region and a drain region on two sides of the channel region. The channel region is undoped or doped in a different type from the source region and drain region. Thus, the channel region has semiconductor characteristics. The conducting region p2 is doped and thus is electrically conductive. Doped impurities vary with the type of transistor (i.e., N type or P type). Coupling between the source and drain of different transistors is considered as coupling between the source region and drain region, that is coupling through the conducting region. As described in the foregoing embodiments, the source is the first electrode, and the drain is the second electrode.

In some embodiments, in the second direction X2, for each subpixel 02, the sum of the length of the conducting region p2 of the second portion Po2 and the length of the conducting region p2 of the third portion Po3 of the subpixel 02 is 0.8 to 1.2 times the length of the subpixel 02, that is, the sum of the length of the conducting region p2 of the second portion Po2 and the length of the conducting region p2 of the third portion Po3 of the subpixel 02 is approximately equal to the length of the subpixel 02, which can further facilitate the high-PPI design.

Figure 20:
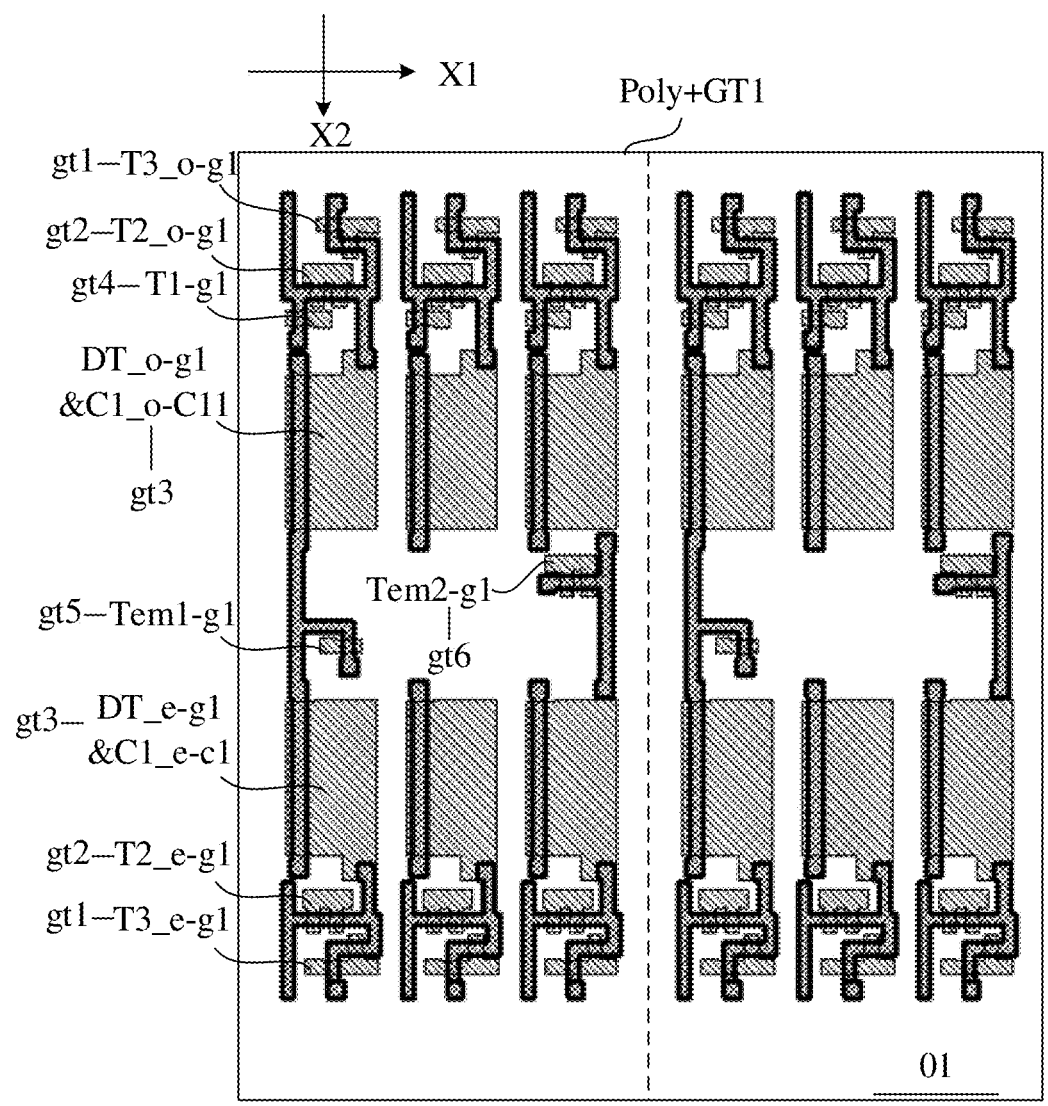
FIG. 20 is a diagram of a structural layout of some film layers in still another display panel according to some embodiments of the present disclosure.
Figure 21:
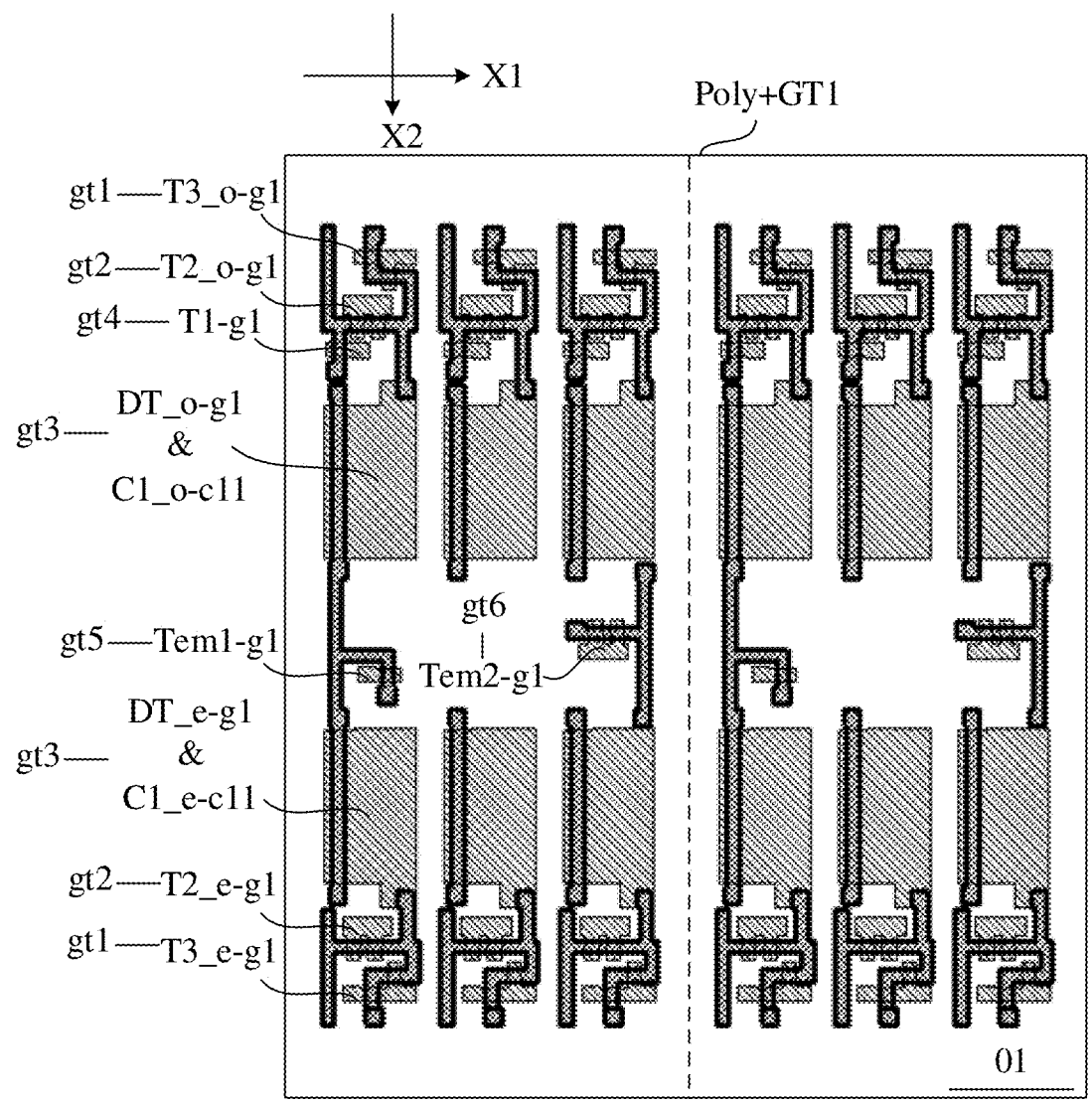
FIG. 21 is a diagram of a structural layout of some film layers in yet another display panel according to some embodiments of the present disclosure.

In some embodiments, taking the structure shown in FIG. 14 as an example, FIG. 20 shows a structural layout of yet another display panel. Taking the structure shown in FIG. 16 as an example, FIG. 21 shows a structural layout of yet another display panel. Referring to FIG. 20 and FIG. 21, the display panel further includes a first conductive layer GT1 on the side of the active layer Poly away from the substrate 01. The first conductive layer GT1 includes the gates g1 of the transistors and a first electrode plate c11 of the storage capacitor C1 in the subpixel. The first conductive layer GT1 is also referred to as a first gate metal layer.

For one subpixel 02, the first conductive layer GT1 of the subpixel 02 includes a first portion gt1, a second portion gt2, and a third portion gt3 arranged at intervals in the second direction X2. The first portion gt1 includes the gate T3-g1 of the sixth transistor T3 in the subpixel 02. The second portion gt2 includes the gate T2-g1 of the fourth transistor T2. The third portion gt3 includes a first electrode plate c11 of the storage capacitor C1 and the gate DT-g1 of the fifth transistor DT in the subpixel 02.

In the two subpixels 02 in two adjacent rows, the first conductive layer GT1 of one subpixel 02 further includes a fourth portion gt4 disposed between the second portion gt2 and the third portion gt3. The fourth portion gt4 includes the gate T1-g1 of the shared third transistor T1.

The first conductive layer GT1 of each of the two subpixels 02 in the two adjacent rows further includes a fifth portion gt5 and a sixth portion gt6 that are arranged at intervals in the first direction X1 and are shared. The fifth portion gt5 includes the gate Tem1-g1 of the shared first transistor Tem1. The sixth portion gt6 includes the gate Tem2-g1 of the shared second transistor Tem2.

For each transistor, an orthographic projection of the gate of the transistor on the substrate 01 overlaps an orthographic projection of the active region of the transistor on the substrate 01. It should be noted that overlapping refers to partial overlapping or complete overlapping, and partial overlapping is used as an example for illustration in the embodiments of the present disclosure.

Figure 22:
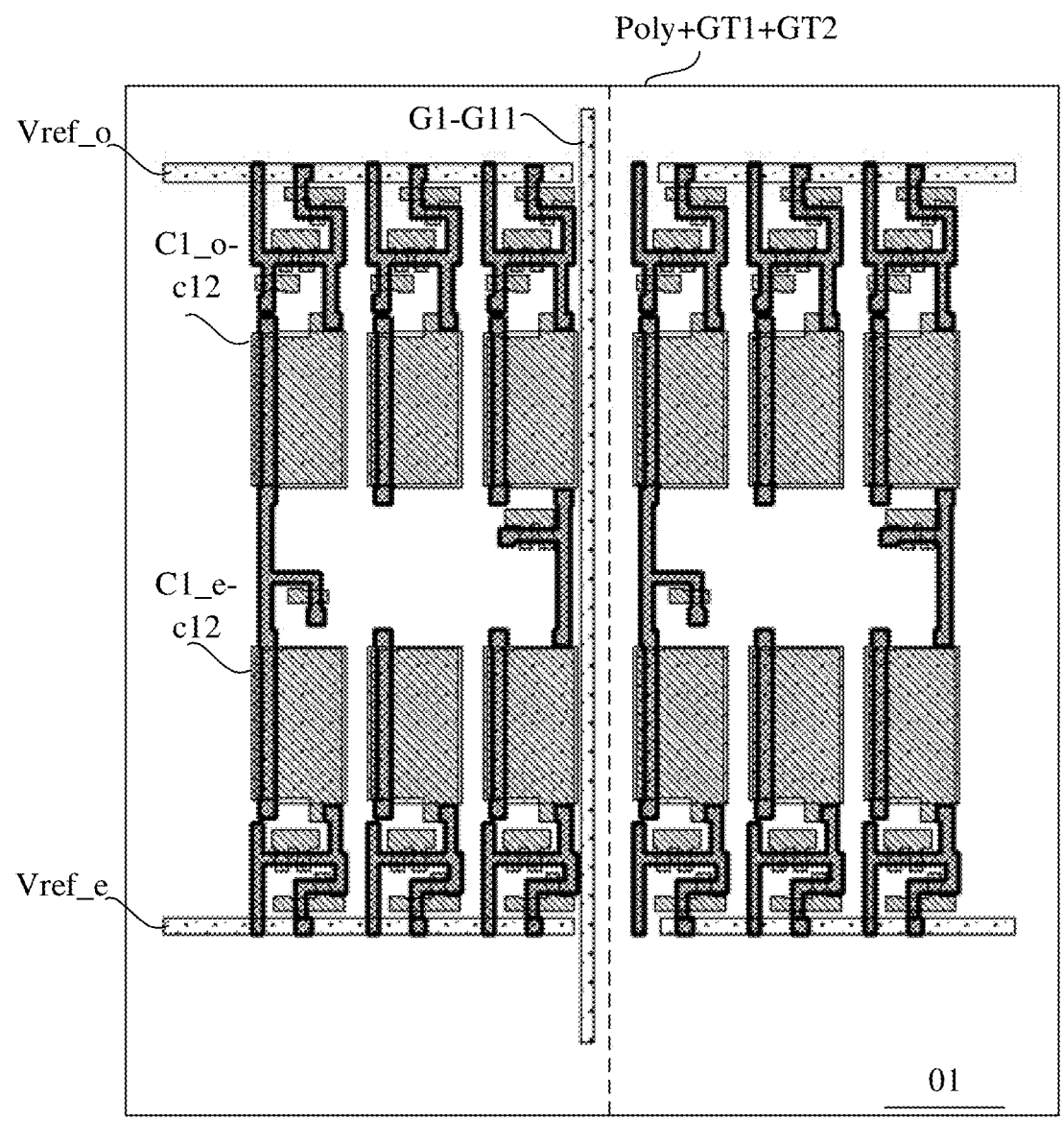
FIG. 22 is a diagram of a structural layout of some film layers in yet another display panel according to some embodiments of the present disclosure.

In some embodiments, taking the structures shown in FIG. 14 and FIG. 16 as an example, FIG. 22 shows a structural layout of yet another display panel. As shown in FIG. 22, the display panel further includes a second conductive layer GT2 on the side of the first conductive layer GT1 away from the substrate 01. The second conductive layer GT2 is also referred to as a second gate metal layer.

The second conductive layer GT2 includes a second electrode plate c12 of the storage capacitor C1 in the subpixel. The second conductive layer GT2 further includes the third power line Vref and the first portion G11 of the third control line G1.

In the second conductive layer GT2, the second electrode plates c12 of the storage capacitors C1 in the subpixels 02 are spaced apart from each other. For each subpixel 02, an orthographic projection of the first electrode plate c11 of the storage capacitor C1 in the subpixel 02 on the substrate 01 overlaps an orthographic projection of the second electrode plate c12 on the substrate 01. An orthographic projection of the third power line Vref in the second conductive layer GT2 on the substrate 01 overlaps an orthographic projection of the first portion Po1 of the active layer Poly in each subpixel 02 on the substrate 01.

Figure 23:
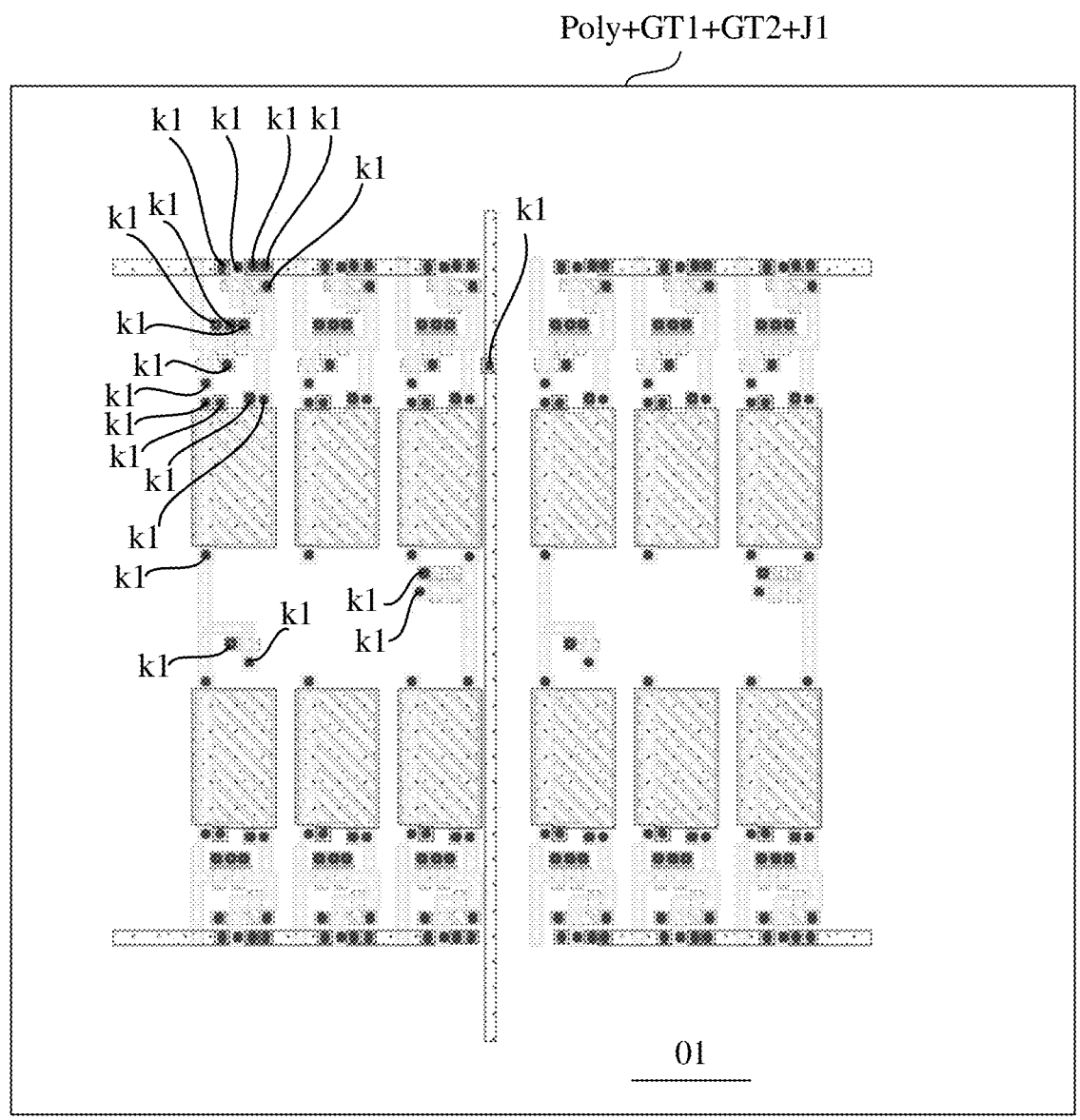
FIG. 23 is a diagram of a structural layout of some film layers in yet another display panel according to some embodiments of the present disclosure.

In some embodiments, taking the structure shown in FIG. 14 as an example, FIG. 23 shows a structural layout of yet another display panel. Referring to FIG. 23, the display panel further includes a first insulating layer J1 disposed on the side of the second conductive layer GT2 away from the substrate 01, and a plurality of first via holes K1 penetrating through the first insulating layer J1.

Figure 24:
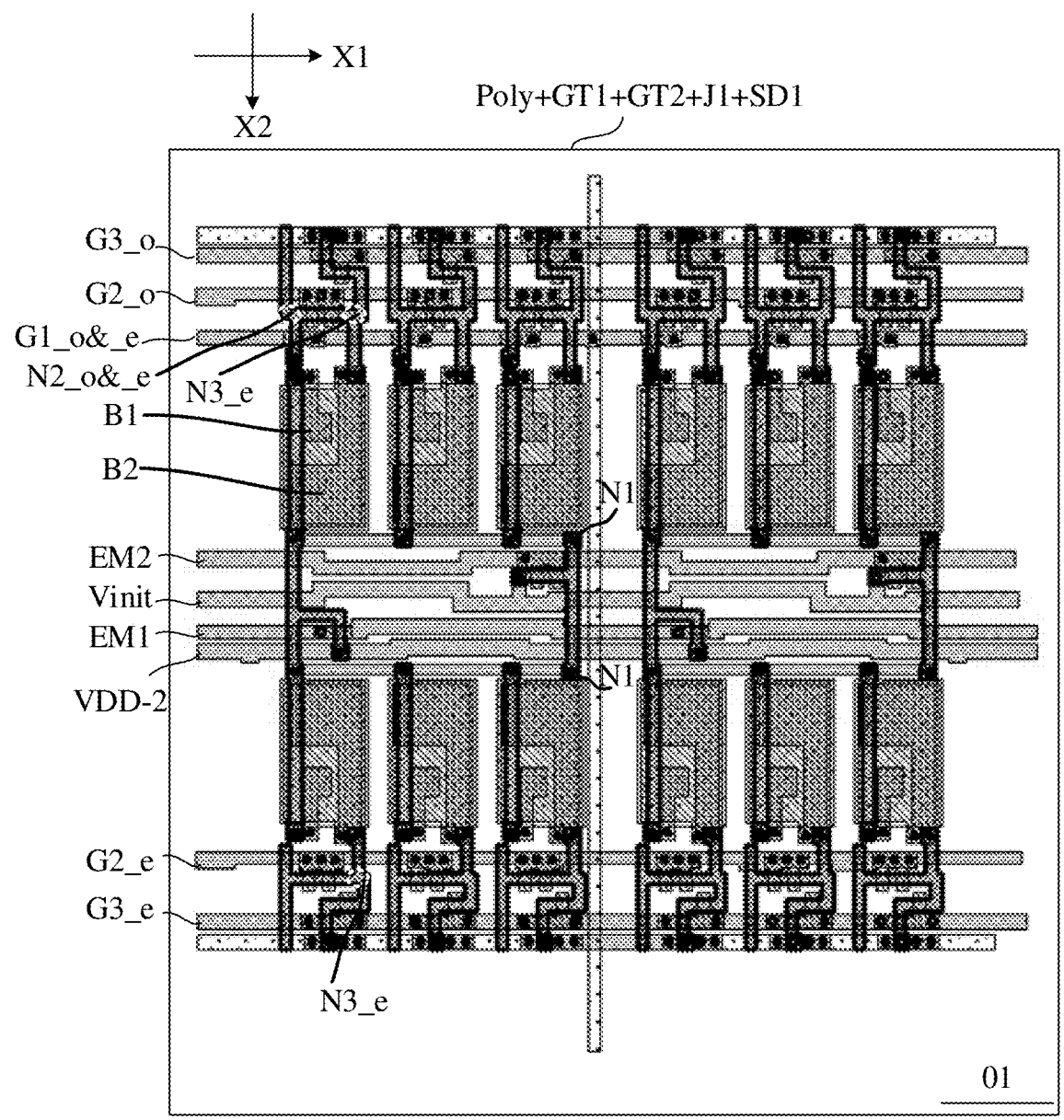
FIG. 24 is a diagram of a structural layout of some film layers in yet another display panel according to some embodiments of the present disclosure.
Figure 25:
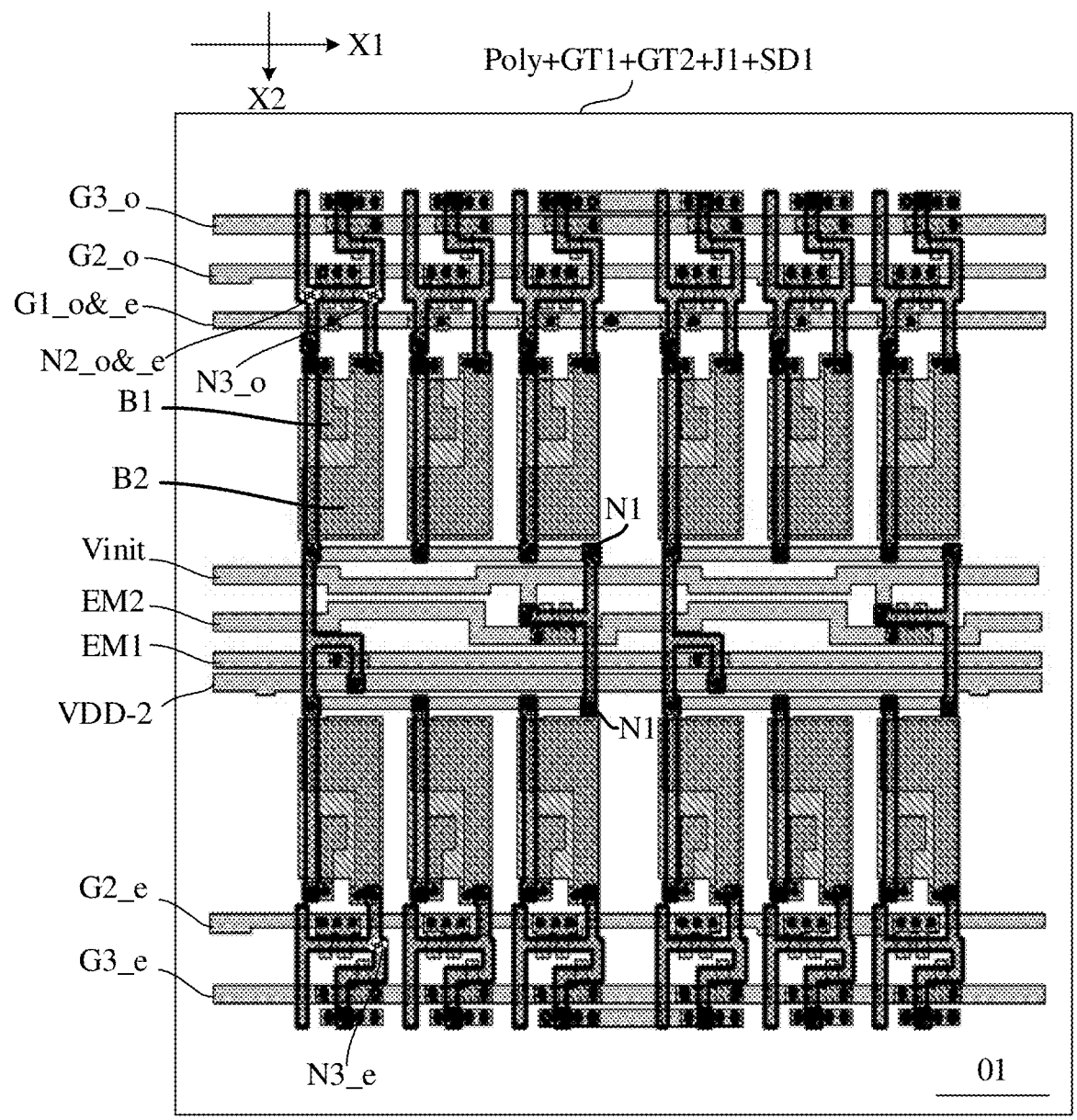
FIG. 25 is a diagram of a structural layout of some film layers in yet another display panel according to some embodiments of the present disclosure.

In some embodiments, taking the structure shown in FIG. 14 as an example, FIG. 24 shows a structural layout of yet another display panel. Taking the structure shown in FIG. 16 as an example, FIG. 25 shows a structural layout of yet another display panel. Referring to FIG. 24 and FIG. 25, the display panel further includes a third conductive layer SD1 disposed on the side of the first insulating layer J1 away from the substrate 01. That is, the display panel includes the first insulating layer J1 and the third conductive layer SD1 sequentially laminated on the side of the second conductive layer GT2 away from the substrate 01, and the plurality of first via holes K1 penetrating through the first insulating layer J1. The third conductive layer SD1 is also referred to as a first source-drain metal layer.

The third conductive layer SD1 includes the first control line EM1, the second control line EM2, the second portion G12 of the third control line G1, the fourth control line G2, the fifth control line G3, the second power line Vinit, the second portion VDD-2 of the first power line VDD, and a plurality of first connection portions B1 and a plurality of second connection portions B2 in one-to-one correspondence with the plurality of subpixels 02. The plurality of first connection portions B1 and the plurality of second connection portions B2 are spaced apart from each other in both the first direction X1 and the second direction X2. As shown in the figure, the first connection portion B1 and the second connection portion B2 are both L-shaped.

For each subpixel 02, one end of the first connection portion B1 is coupled to the second portion Po2 of the active layer Poly of the subpixel 02 through the first via hole K1 and the other end is coupled to the light-emitting element L1 of the subpixel 02, to couple the second electrode of the fifth transistor DT, the first electrode of the light-emitting element L1, and the second electrode plate c12 of the storage capacitor C1 to each other. The second connection portion B2 is coupled to the first portion Po1 of the active layer Poly of the subpixel 02 through the first via hole K1, to couple the first electrode plate c11 of the storage capacitor C1, the second electrode of the fourth transistor T2, and the second electrode of the sixth transistor T3 to each other.

An orthographic projection of a part, serving as the first control line EM1, of the third conductive layer SD1 on the substrate 01 overlaps an orthographic projection of the gate Tem1-g1 of the first transistor Tem1 on the substrate 01, and this part is coupled to the gate of the first transistor Tem1 through the first via hole K1 so as to couple the gate of the first transistor Tem1 and the first control line EM1 to each other.

An orthographic projection of a part, serving as the second control line EM2, of the third conductive layer SD1 on the substrate 01 overlaps an orthographic projection of the gate Tem2-g1 of the second transistor Tem2 on the substrate 01, and this part is coupled to the gate of the second transistor Tem2 through the first via hole K1 so as to couple the gate of the second transistor Tem2 and the second control line EM2 to each other.

An orthographic projection of a part, serving as the second portion G12 of the third control line G1, of the third conductive layer SD1 on the substrate 01 overlaps an orthographic projection of the gate T1-g1 of the third transistor T1 on the substrate 01, and this part is coupled to the gate of the third transistor T1 through the first via hole K1 so as to couple the gate of the third transistor T1 and the third control line G1 to each other.

An orthographic projection of a part, serving as the fourth control line G2, of the third conductive layer SD1 on the substrate 01 overlaps an orthographic projection of the gate T2-g1 of the fourth transistor T2 on the substrate 01, and this part is coupled to the gate of the fourth transistor T2 through the first via hole K1 so as to couple the gate of the fourth transistor T2 and the fourth control line G2 to each other.

An orthographic projection of a part, serving as the fifth control line G3, of the third conductive layer SD1 on the substrate 01 overlaps an orthographic projection of the gate T3-g1 of the sixth transistor T3 on the substrate 01, and this part is coupled to the gate of the sixth transistor T3 through the first via hole K1 so as to couple the gate of the sixth transistor T3 and the fifth control line G3 to each other.

An orthographic projection of a part, serving as the second power line Vinit, of the third conductive layer SD1 on the substrate 01 overlaps an orthographic projection of the fourth portion Po4 of the active layer Poly of the subpixel 02 on the substrate 01, and this part is coupled to the fourth portion Po4 through the first via hole K1 so as to couple first electrode of the second transistor Tem2 and the second power line Vinit to each other. Therefore, in the foregoing embodiments, the distances L0 from the via hole through which the second transistor Tem2 is coupled to the second power line Vinit to the two subpixels 02 in the second direction X2 being approximately equal refers to that the distances L0 from the first via hole k1 through which the second transistor Tem2 is coupled to the second power line Vinit to the two subpixels 02 are approximately equal.

An orthographic projection of a part, serving as the third power line Vref, of the second conductive layer GT2 on the substrate 01 overlaps an orthographic projection of the first portion Po1 of the active layer Poly of the subpixel 02 on the substrate 01, and this part is coupled to the first portion Po1 through the first via hole K1 so as to couple the first electrode of the sixth transistor T3 and the third power line Vref to each other.

An orthographic projection of a part, serving as the first portion G11 of the third control line G1, of the second conductive layer GT2 on the substrate 01 overlaps the orthographic projection of the part, serving as the second portion G12 of the third control line G1, of the third conductive layer SD1 on the substrate 01, and the part, serving as the first portion G11 of the third control line G1, of the second conductive layer GT2 is coupled to the part, serving as the second portion G12 of the third control line G1, of the third conductive layer SD1 through the first via hole K1, so as to couple the first portion G11 and the second portion G12 as a whole to form the third control line G1.

Figure 26:
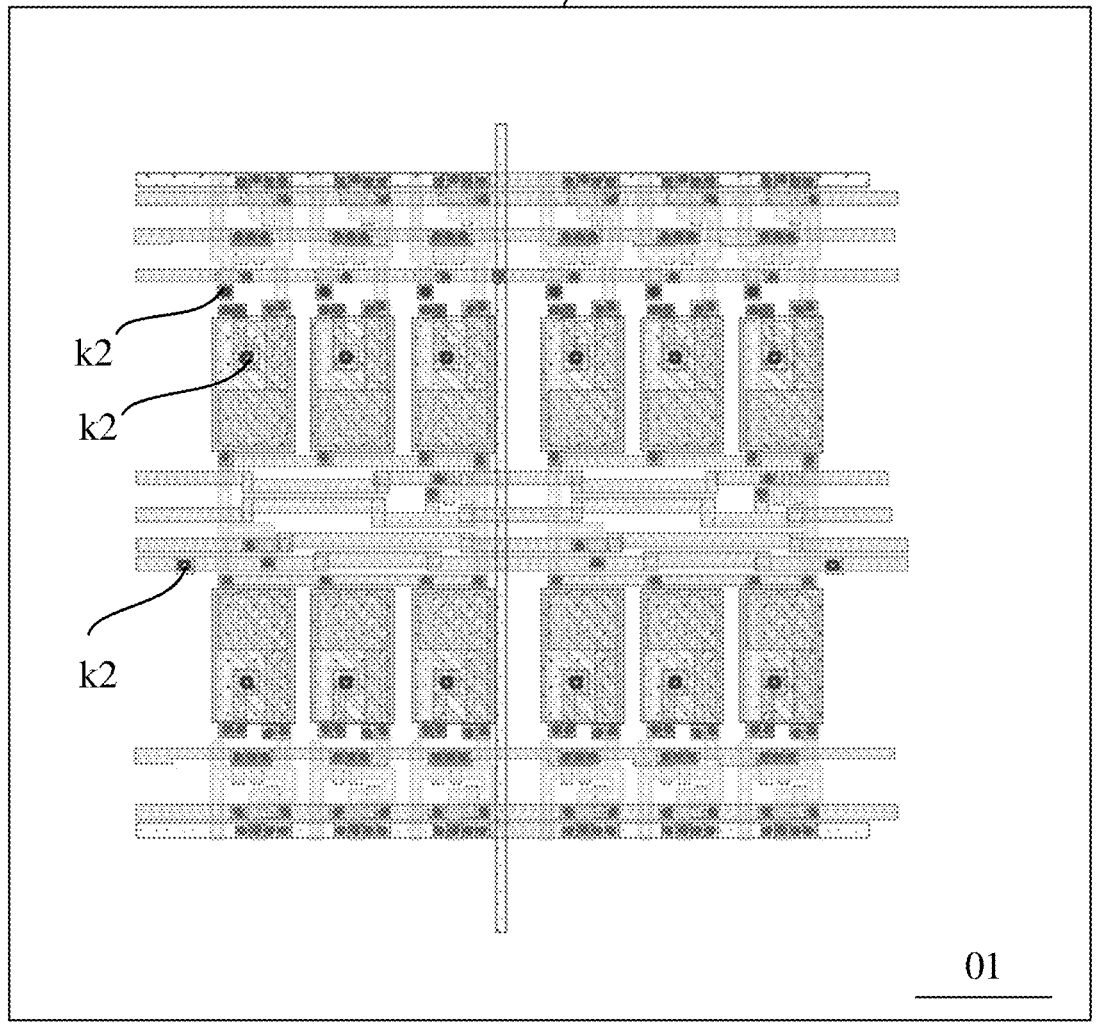
FIG. 26 is a diagram of a structural layout of some film layers in yet another display panel according to some embodiments of the present disclosure.
Figure 27:
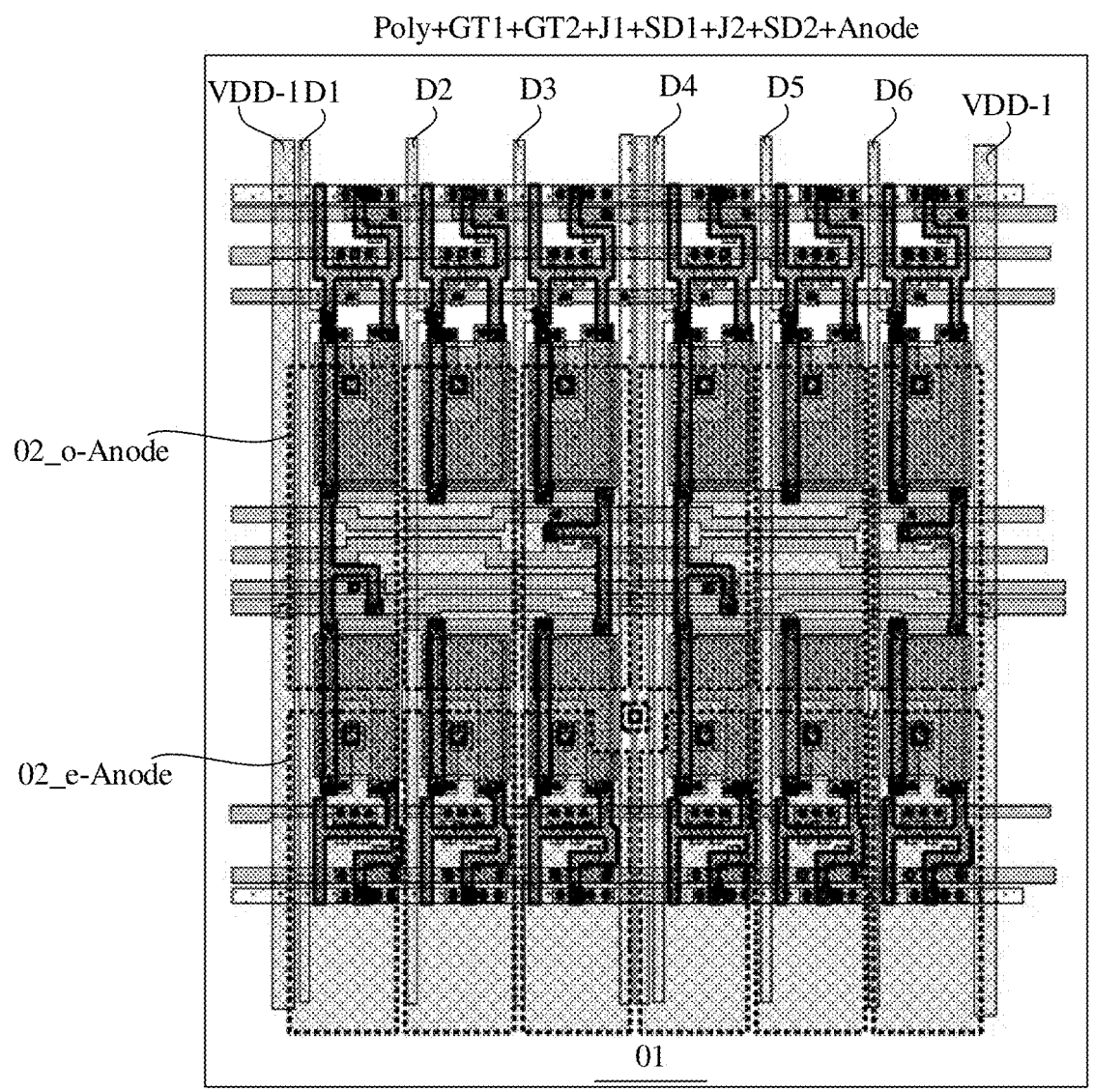
FIG. 27 is a diagram of a structural layout of some film layers in yet another display panel according to some embodiments of the present disclosure.

In some embodiments, taking the structure shown in FIG. 14 as an example, FIG. 26 shows a structural layout of yet another display panel. Referring to FIG. 26, the display panel further includes a second insulating layer J2 disposed on the side of the third conductive layer SD1 away from the substrate 01, and a plurality of second via holes K2 penetrating through the second insulating layer J2. FIG. 27 shows a structural layout of yet another display panel. With reference to FIG. 26 and FIG. 27, the display panel further includes a fourth conductive layer SD2 disposed on the side of the second insulating layer J2 away from the substrate 01. That is, the display panel includes the second insulating layer J2 and the fourth conductive layer SD2 sequentially laminated on the side of the third conductive layer SD1 away from the substrate 01, and the plurality of second via holes K2 penetrating through the second insulating layer J2. The fourth conductive layer SD2 is also referred to as a second source-drain metal layer. The light-emitting element L1 includes an anode layer Anode disposed on a side of the substrate 01.

The fourth conductive layer SD2 includes the first portion VDD-1 of the first power line VDD and the data line D1.

An orthographic projection of a part, serving as the first portion VDD-1 of the first power line VDD, of the fourth conductive layer SD2 on the substrate 01 overlaps an orthographic projection of a part, serving as the second portion VDD-2 of the first power line VDD, of the third conductive layer SD1 on the substrate 01. The part, serving as the first portion VDD-1 of the first power line VDD, of the fourth conductive layer SD2 is coupled to the part, serving as the second portion VDD-2 of the first power line VDD, of the third conductive layer SD1 through the second via hole K2, so as to couple the first portion VDD-1 and the second portion VDD-2 as a whole to form the first power line VDD.

An orthographic projection of a part, serving as the data line D1, of the fourth conductive layer SD2 on the substrate 01 overlaps an orthographic projection of the first portion Po1 of the active layer Poly of the subpixel 02 on the substrate 01. The part, serving as the data line D1, of the fourth conductive layer SD2 is coupled to the first portion Po1 through the first via hole K1, so as to couple the first electrode of the third transistor T1 and the data line D1 to each other.

The other end of the first connection portion B1 is coupled to the anode layer Anode of the light-emitting element L1 through the second via hole K2, to couple the fifth transistor DT, the second electrode plate c12 of the storage capacitor C1, and the anode of the light-emitting element L1 to each other.

It should be noted that the conductive layer including the signal lines refers to that the signal lines and the conductive layer are disposed in the same layer. "Being disposed in the same layer" refers to that a film layer for forming specific patterns is formed through the same film forming process, and then the film layer is patterned by using the same mask through a one-time patterning process to form the layer structure. Depending on different specific patterns, the one-time patterning process includes a plurality of times of exposure, development, or etching processes, and the specific patterns in the formed layer structure are continuous or discontinuous. That is, the plurality of elements, components, structures, and/or portions in the "same layer" are made from the same material and are formed through the same patterning process, which can simplify the manufacturing processes, reduce the manufacturing costs and improve manufacturing efficiency. On this basis, the signal lines and the metal layer being disposed in the same layer refers to that the metal layer is configured to form the signal lines.

Figure 28:
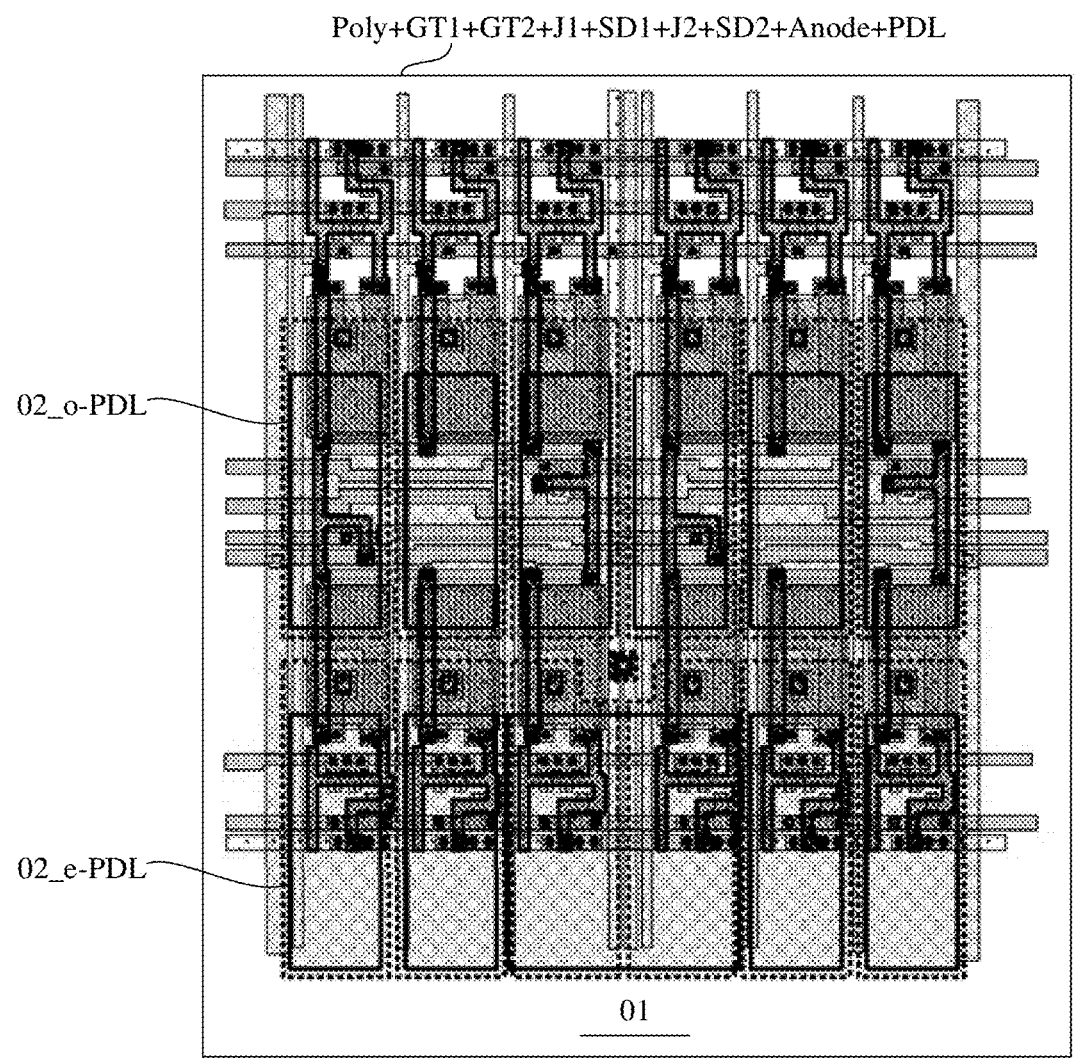
FIG. 28 is a diagram of a structural layout of some film layers in yet another display panel according to some embodiments of the present disclosure.

In some embodiments, on the basis of the structure shown in FIG. 27, referring to the structure shown in FIG. 28, the display panel further includes a pixel defining layer PDL disposed on the side of the anode layer Anode away from the substrate 01. The pixel defining layer PDL is configured to define a light-emitting region of each subpixel 02.

Figure 29:
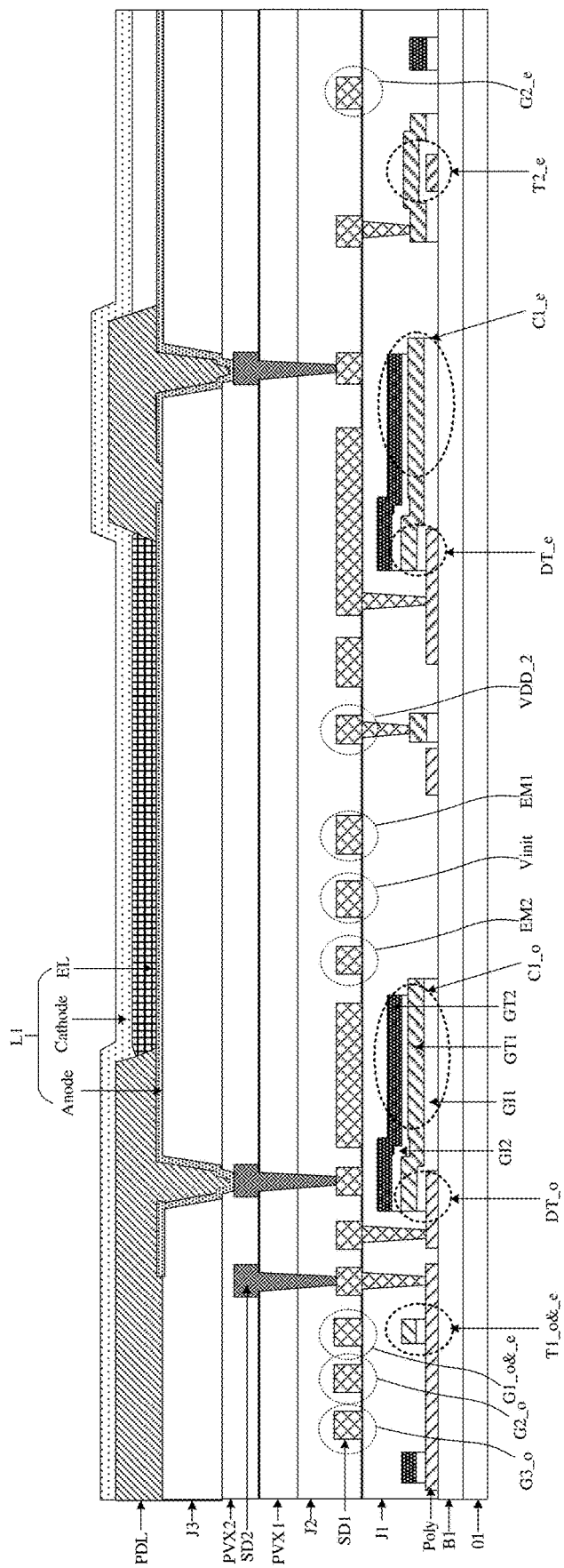
FIG. 29 is a sectional view of the structure shown in FIG. 14 in a kk' direction.

For example, the light-emitting element L1 is an OLED. Taking the structure shown in FIG. 14 as an example, FIG. 29 is a sectional view of a display panel in a kk' direction. As can be seen from FIG. 14 and FIG. 29, in the embodiments of the present disclosure, the light-emitting element L1 includes the anode layer Anode, a light-emitting material layer EL, and a cathode layer Cathode that are sequentially laminated on a side of the substrate 01.

The display panel includes the active layer Poly, the first gate metal layer GT1, the second gate metal layer GT2, the first insulating layer J1, the first source-drain metal layer SD1, the second insulating layer J2, and the second source-drain metal layer SD2 that are sequentially laminated between the substrate 01 and the light-emitting element L1, and further includes the pixel defining layer PDL disposed between the light-emitting material layers EL of the light-emitting elements L1 in every two subpixels 02. The first insulating layer J1 is also referred to as an interlayer dielectric layer (ILD). The first insulating layer J1 and the second insulating layer J2 are both provided with via holes. For each insulating layer, if the conductive layers disposed on adjacent two sides of the insulating layer need to be coupled, the conductive layers can be reliably lapped through the via holes in the insulating layer. For example, the first source-drain metal layer SD1 is lapped with the active layer P1 and the first gate metal layer GT1 through the via holes penetrating through the first insulating layer J1. That is, the display panel adopts a dual-gate structure, and the via holes penetrating through the insulating layer are formed at dual-gate positions, thereby further reducing the line resistance while lapping is ensured.

It should be noted that in the embodiments of the present disclosure, there is more than one via hole penetrating through the insulating layer. That is, a plurality of via holes penetrating through the insulating layer are formed to achieve reliable lapping between different layers. For example, with reference to FIG. 23 to FIG. 26, the part, serving as the fourth control line G2, of the third conductive layer SD1 is coupled to the gate of the fourth transistor T2 through three first via holes K1 penetrating through the first insulating layer J1.

In some embodiments, referring to FIG. 29, in addition to the foregoing film layers, the display panel further includes a third insulating layer J3 disposed between the anode layer Anode and the fourth conductive layer SD2. On this basis, for the structures shown in FIG. 14 to FIG. 29, at least 10 mask processes are used according to the laminating order.

Referring to FIG. 29, the display panel further includes a buffer layer B1 disposed between the substrate 01 and the active layer Poly, a first gate insulating layer GI1 disposed between the active layer Poly and the first gate metal layer GT1, a second gate insulating layer GI2 disposed between the first gate metal layer GT1 and the second gate metal layer GT2, and a first passivation layer PVX1 and a second passivation layer PVX2 sequentially laminated between the second insulating layer J2 and the third insulating layer J3. Each film layer mentioned herein is configured to insulate two layers on different sides thereof to avoid signal interference.

In some embodiments, in the embodiments of the present disclosure, the material of the active layer P1 includes polysilicon. For example, the material of the active layer P1 of an LTPS transistor is LTPS. The material of the second insulating layer J2 and the material of the third insulating layer J3 are an organic insulating material (for example, resin). The material of the anode layer Anode of the light-emitting element L1 is indium tin oxide (ITO). The material of the first passivation layer PVX1 and the material of the second passivation layer PVX2 are an inorganic insulating material.

For example, the structure shown in FIG. 10 includes 4 adjacent rows of subpixels 02 (subpixels 02 belonging to one partition), the subpixel 02 in the first row, which is an odd row, and the subpixel 02 in the second row, which is an even row, share the target circuit and the target signal line, the subpixel 02 in the third row, which is an odd row, and the subpixel 02 in the fourth row, which is an even row, share the target circuit and the target signal line, and the transistor is an N-type transistor. Correspondingly, the first potential is a high potential, and the second potential is a low potential. The principle of driving the 4 rows of subpixels 02 is described hereinafter.

Figure 30:
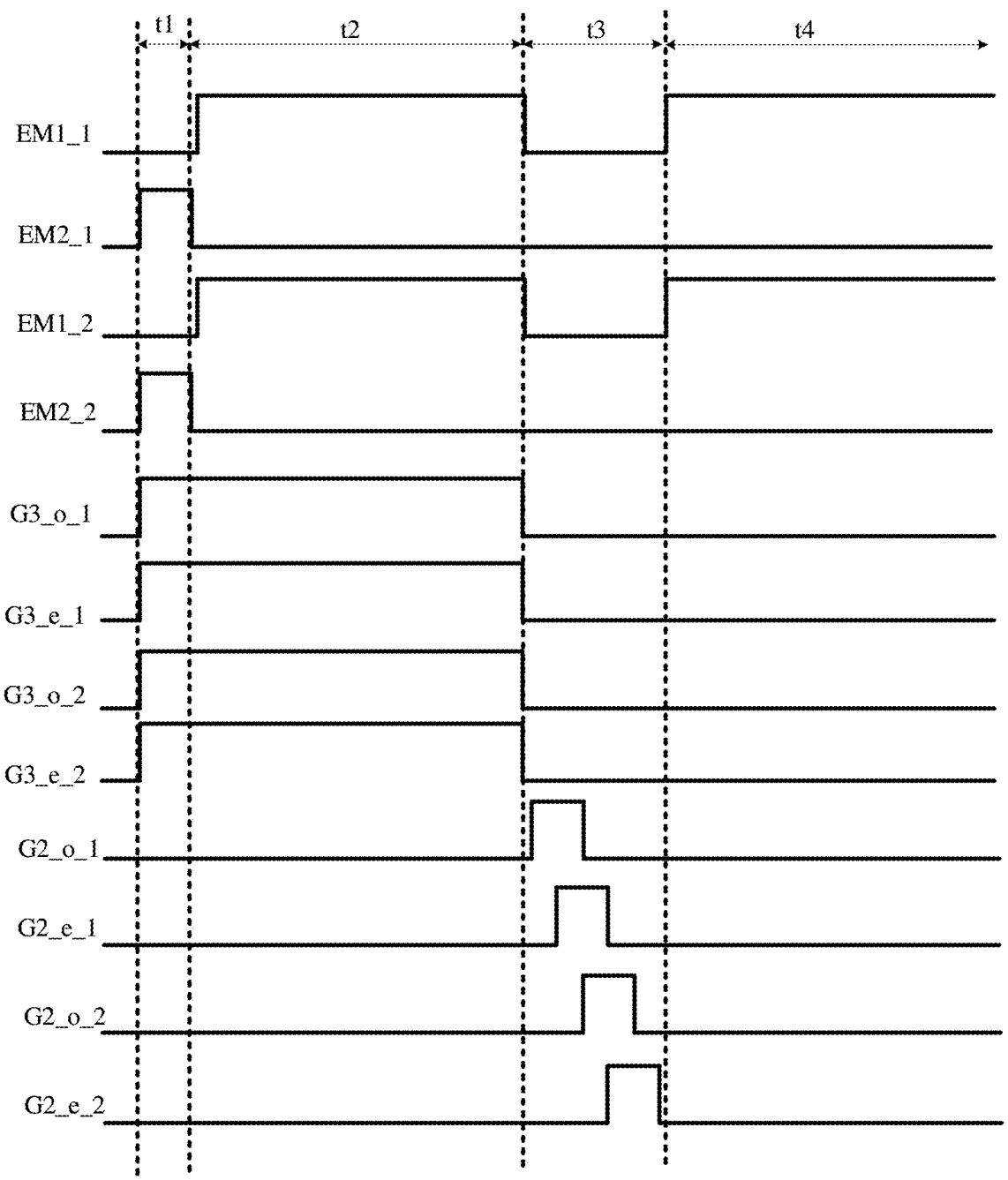
FIG. 30 is a time sequence diagram of signal lines to which subpixels in a display panel are coupled according to some embodiments of the present disclosure.

FIG. 30 is a time sequence diagram of signal lines to which the 4 rows of subpixels are coupled. The first control line EM1 shared by the subpixel 02 in the first row and the subpixel 02 in the second row is denoted as EM1_1. The first control line EM1 shared by the subpixel 02 in the third row and the subpixel 02 in the fourth row is denoted as EM1_2. The second control line EM2 shared by the subpixel 02 in the first row and the subpixel 02 in the second row is denoted as EM2_1. The second control line EM2 shared by the subpixel 02 in the third row and the subpixel 02 in the fourth row is denoted as EM2_2. The fourth control line G2 to which the subpixel 02 in the first row is coupled is denoted as G2_e_1. The fifth control line G3 to which the subpixel 02 in the first row is coupled is denoted by G3_e_1. The fourth control line G2 to which the subpixel 02 in the second row is coupled is denoted as G2_o_1. The fifth control line G3 to which the subpixel 02 in the second row is coupled is denoted as G3_o_1. The fourth control line G2 to which the subpixel 02 in the third row is coupled is denoted as G2_e_2. The fifth control line G3 to which the subpixel 02 in the third row is coupled is denoted as G3_e_2. The fourth control line G2 to which the subpixel 02 in the fourth row is coupled is denoted as G2_0_2. The fifth control line G3 to which the subpixel 02 in the fourth row is coupled is denoted as G3_o_2.

In the entire driving process, the third control line G1 shared by the subpixel 02 in the first row and the subpixel 02 in the second row and the third control line G1 shared by the subpixel 02 in the third row and the subpixel 02 in the fourth row provide third control signals at the high potential, and data is refreshed in a current frame. Certainly, in the case that the third control lines G1 provide the third control signals at the low potential, the display is maintained in a scanning state of a previous frame, and the data is not refreshed.

As can be seen from FIG. 30, the entire process is divided into four phases, i.e., a reset phase t1, a compensation phase t2, a data writing phase t3, and a light-emitting phase t4.

In the reset phase t1, the first control signals provided by the first control lines EM1_1 and EM1_2 are both at the low potential. The second control signals provided by the second control lines EM2_1 and EM2_2 are both at the high potential. The fourth control signals provided by the fourth control lines G2_o_1, G2_e_1, G2_o_2, and G2_e_2 are all at the low potential. The fifth control signals provided by the fifth control lines G3_o_1, G3_e_1, G3_o_2, and G3_e_2 are all at the high potential. Therefore, in each subpixel 02, the first transistor Tem1 and the fourth transistor T2 are both turned off, and the second transistor Tem2 and the sixth transistor T3 are both turned on. Correspondingly, in each subpixel 02, the second power signal provided by the second power line Vinit is transmitted to the first node N1 through the turned-on second transistor Tem2, to simultaneously reset the first node N1 (i.e., the source of the fifth transistor DT). In each subpixel 02, the third power signal provided by the third power line Vref is transmitted to the third node N3 through the turned-on sixth transistor T3, to simultaneously reset the third node N3 (i.e., the gate of the fifth transistor DT). Under the coupling effect of the storage capacitor C1, the third power signal transmitted to the third node N3 is transmitted to the anode of the light-emitting element L1 to simultaneously reset the anode of the light-emitting element L1 (which is also considered as the drain of the fifth transistor DT) indirectly. Thus, the subpixels 02 in the 4 rows are simultaneously reset.

In the compensation phase t2, the first control signals provided by the first control lines EM1_1 and EM1_2 are both at the high potential. The second control signals provided by the second control lines EM2_1 and EM2_2 are both at the low potential. The fourth control signals provided by the fourth control lines G2_o_1, G2_e_1, G2_o_2, and G2_e_2 are all at the low potential. The fifth control signals provided by the fifth control lines G3_o_1, G3_e_1, G3_o_2, and G3_e_2 are all at the high potential. Therefore, in each subpixel 02, the second transistor Tem2 and the fourth transistor T2 are both turned off, and the first transistor Tem1 and the sixth transistor T3 are both turned on. Correspondingly, in each subpixel 02, the third power line Vref continuously transmits the third power signal to the third node N3. At the same time, in each subpixel 02, the first power signal provided by the first power line VDD is transmitted to the first node N1 through the turned-on first transistor Tem1, to simultaneously charge the first node N1 until the potential of the signal at the source of the fifth transistor DT becomes Vref-Vth, and the compensation phase ends. Here, Vth is a threshold voltage of the fifth transistor DT.

In the data writing phase t3, the first control signals provided by the first control lines EM1_1 and EM1_2 are both at the low potential. The second control signals provided by the second control lines EM2_1 and EM2_2 are both at the low potential. The potentials of the fourth control signals provided by the fourth control lines G2_o_1, G2_e_1, G2_o_2, and G2_e_2 sequentially become the high potential. The fifth control signals provided by the fifth control lines G3_o_1, G3_e_1, G3_o_2, and G3_e_2 are all at the low potential. Therefore, in each subpixel 02, the first transistor Tem1, the second transistor Tem2, and the sixth transistor T3 are all turned off. The fourth transistors T2 in the subpixels 02 are sequentially turned on. Correspondingly, the data signal written into the second node N2 is transmitted to the third nodes N3 row by row through the fourth transistors T2 that are sequentially turned on, to sequentially charge the third nodes N3. In this case, the potential at the third node N3 is considered as the high potential.

In the light-emitting phase t4, the first control signals provided by the first control lines EM1_1 and EM1_2 are both at the high potential. The second control signals provided by the second control lines EM2_1 and EM2_2 are both at the low potential. The fourth control signals provided by the fourth control lines G2_o_1, G2_e_1, G2_o_2, and G2_e_2 are all at the low potential. The fifth control signals provided by the fifth control lines G3_o_1, G3_e_1, G3_o_2, and G3_e_2 are all at the low potential. Under the coupling effect of the storage capacitor C1, the potential of the third node N3 maintains the high potential in the data writing phase t3. Therefore, in each subpixel 02, the second transistor Tem2, the fourth transistor T2, and the sixth transistor T3 are all turned off, and the first transistor Tem1 and the fifth transistor DT are turned on. Correspondingly, in each subpixel 02, a loop is formed between the first power line VDD and the pull-down power line VSS, and the fifth transistor DT transmits a driving current to the anode of the light-emitting element L1 based on the potential at the third node N3 and the potential at the first node N1, to drive the light-emitting element L1 to emit light. Thus, the subpixels 02 in the 4 rows simultaneously emit light.

In the data writing phase t3, the first control signals provided by the first control lines EM1_1 and EM1_2 are both at the low potential, and the subpixels 02 sequentially write the data signals. In the light-emitting phase t4, the subpixels 02 in the 4 rows simultaneously emit light. Therefore, during writing the data signals, after the subpixels in the odd column write the date signals, the subpixels in the odd column need to wait for the subpixels in the even column to write the data signals before emitting light. In this way, when the drain of the fifth transistor DT is decoupled from the first power line VDD, the grayscale variation of the subpixels in the odd columns is not affected. Therefore, the subpixels provided in the embodiments of the present disclosure is compatible with a data line shared circuit D-Mux.

Figure 31:
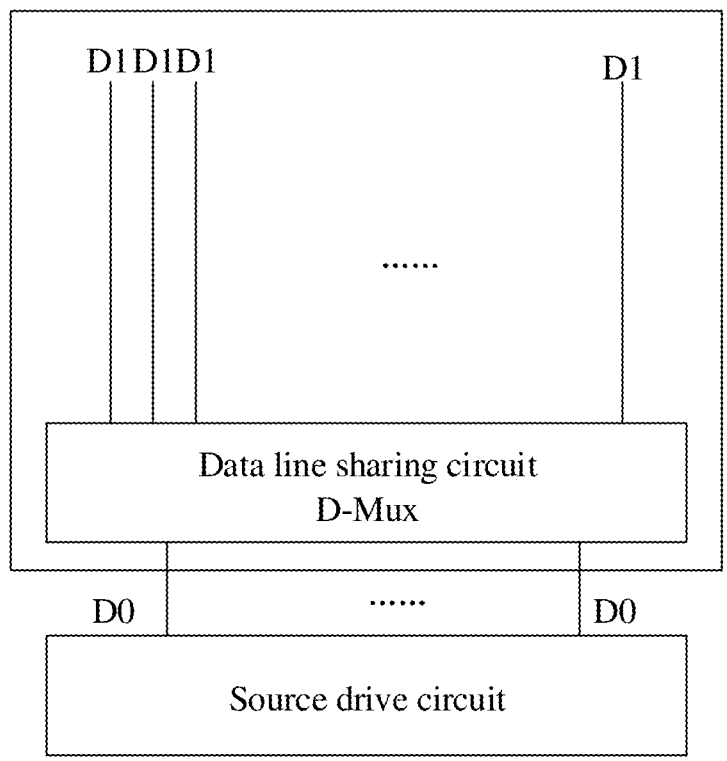
FIG. 31 is a schematic structural diagram of yet another display panel according to some embodiments of the present disclosure.

Referring to FIG. 31, the display panel provided in the embodiments of the present disclosure further includes a plurality of data line leads D0 and a data line shared circuit D-Mux disposed on a side of the substrate 01. The number of the plurality of data line leads D0 is less than the number of the plurality of data lines D1.

The data line shared circuit D-Mux is coupled to the plurality of data lines D1, and is further coupled to a source drive circuit through the plurality of data line leads D0. The data line shared circuit D-Mux is configured to transmit a data signal transmitted by the source drive circuit to one of the data line leads D0 to at least two of the plurality of data lines D1 in a time-sharing manner.

It should be noted that the display panel includes a display region and a non-display region. The data line shared circuit D-Mux is generally disposed in the non-display region. The data lines D1 are disposed in the display region and the non-display region.

Therefore, in comparison with the case where the source drive circuit is directly coupled to the plurality of data lines D1, by disposing the data line shared circuit D-Mux to couple the source drive circuit to the plurality of data lines D1 through fewer data line leads D0, the operating power consumption of the source drive circuit can be reduced and the number of pins required for the source drive circuit can be reduced, thereby further facilitating narrow-frame design of the display apparatus.

In summary, the embodiments of the present disclosure provide a display panel. The display panel includes a plurality of subpixels on a side of a substrate. Each subpixel includes a first circuit and a second circuit. The first circuit and the second circuit control the voltage at the first node under the control of the first control line and the second control line. Because at least two subpixels in the plurality of subpixels share the same first node, the sum of the number of the plurality of first control lines and the number of the plurality of second control lines in the display panel can be less than or equal to the number of the subpixels in the column direction. Therefore, a small number of signal lines need to be disposed in the display panel, which facilitates the high-resolution design of the display panel.

Figure 32:
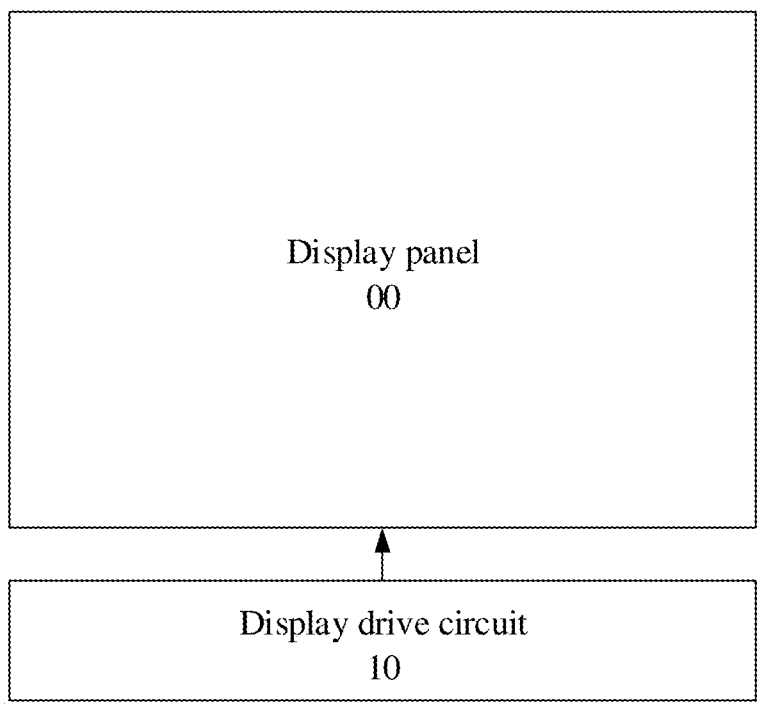
FIG. 32 is a schematic structural diagram of a display apparatus according to some embodiments of the present disclosure.

FIG. 32 is a schematic structural diagram of a display apparatus according to some embodiments of the present disclosure. As shown in FIG. 32, the display apparatus includes a display drive circuit 10 and the display panel 00 shown in the foregoing figures.

The display drive circuit 10 is coupled to the signal lines in the display panel 00. The display drive circuit 10 is configured to provide signals for the signal lines.

For example, the display drive circuit 10 includes the GOA circuit and the source drive circuit described in the foregoing embodiments. The GOA circuit is coupled to the plurality of third control lines G1, the plurality of fourth control lines G2, the plurality of fifth control lines G3, the plurality of first control lines EM1, and the plurality of second control lines EM2 in the display panel 00, and is configured to provide third control signals for the third control lines G1, provide fourth control signals for the fourth control lines G2, provide fifth control signals for the fifth control lines G3, provide light emission control signals for the first control lines EM1, and provide reset control signals for the second control lines EM2. The source drive circuit is coupled to the plurality of data lines D1 in the display panel and configured to provide data signals for the data lines D1. In the structure shown in FIG. 31, it is considered that the source drive circuit is indirectly coupled to the data lines D1 through the data line leads D0.

In some embodiments, the display apparatus is any product or component having a display function, such as an OLED apparatus, electronic paper, a mobile phone, a tablet computer, a television, a display, a notebook computer, a digital photo frame, or a navigator.

It should be understood that the terms such as "first" and "second" in the description of the embodiments of the present disclosure, the claims, and the accompanying drawings are intended to distinguish between similar objects but do not necessarily indicate a specific order or sequence. It should be understood that the terms used in such a way are interchangeable where appropriate, for example, can be implemented in sequences other than those illustrated or described in the embodiments of the present disclosure.

The terms used in the embodiments of the present disclosure are merely intended to explain the embodiments of the present disclosure, rather than limit the present disclosure. Unless otherwise defined, the technical or scientific terms used in the embodiments of the present disclosure should have the general meanings understood by those of ordinary skill in the art to which the present disclosure belongs.

For example, "first", "second", "third", and similar words used in the specification and claims of the present disclosure do not denote any order, quantity, or importance, but are merely intended to distinguish between different constituents.

Similarly, the terms "one", "a/an", and similar words do not limit the quantity, but rather denote the presence of at least one.

"Comprising", "including", and similar words mean that element or article appearing before "comprising" or "including" includes the elements or articles and their equivalent elements appearing behind "comprising" or "including", without excluding any other elements or articles.

"Upper", "lower", "left", "right", and the like are merely used to indicate a relative positional relationship, and when the absolute position of the described object is changed, the relative positional relationship is also changed accordingly. "Connected" or "coupled" refers to electrical connection.

The term "and/or" indicates three types of relationships. For example, "A and/or B" indicates that A exists alone, A and B coexist, or B exists alone. The character "/" usually indicates an "or" relationship between associated objects.

At least two means two or more. At least one of A and B includes three situations: A exists alone, B exists alone, or A and B coexist.

The foregoing descriptions are merely optional embodiments of the present disclosure and are not intended to limit the present disclosure. Any modifications, equivalent replacements, and improvements within the spirit and principles of the present disclosure shall be included within the protection scope of the present disclosure.

What is claimed is:

1. A display panel, comprising:
a substrate;
a plurality of first control lines and a plurality of second control lines on a side of the substrate; and
a plurality of subpixels arranged in an array on the side of the substrate, wherein at least two of the plurality of subpixels share a first node;
wherein the subpixel comprises a first circuit, a second circuit, a third circuit, and a light-emitting element, wherein the first circuit and the second circuit are configured to control a voltage at the first node in response to a first control signal provided by the first control line and a second control signal provided by the second control line respectively, and the third circuit is coupled to the first node and the light-emitting element, and is configured to drive, in response to a potential at the first node, the light-emitting element to emit light;
wherein in the display panel, a sum of a number of the plurality of first control lines and a number of the plurality of second control lines is less than or equal to a number of the subpixels in a column direction.

2. The display panel according to claim 1, wherein at least two subpixels in a same column in the plurality of subpixels share a target circuit and a target signal line; wherein
the target circuit comprises the first circuit and the second circuit; and the target signal line comprises the first control line and the second control line.

3. The display panel according to claim 2, wherein a plurality of subpixels in a same column comprise a plurality of subpixel groups, the subpixel group comprises two subpixels in different rows, and the subpixels in the subpixel group share a target circuit and a target signal line.

4. The display panel according to claim 3, wherein the subpixel group comprises two subpixels in adjacent rows.

5. The display panel according to claim 1, wherein at least two subpixels in a same row in the plurality of subpixels share the first circuit and the second circuit.

6. The display panel according to claim 5, comprising a plurality of pixels arranged in an array, wherein the pixel comprises at least two subpixels, and at least two subpixels sharing the first circuit and the second circuit belong to a same pixel.

7. The display panel according to claim 1, further comprising a plurality of first power lines and a plurality of second power lines on the side of the substrate; wherein
the first circuit is coupled to the first control line, the first power line, and the first node, and is configured to control, in response to the first control signal provided by the first control line, the first power line to be connected to or disconnected from the first node; and
the second circuit is coupled to the second control line, the second power line, and the first node, and is configured to control, in response to the second control signal provided by the second control line, the second power line to be connected to or disconnected from the first node.

8. The display panel according to claim 7, wherein the first circuit comprises a first transistor; and the second circuit comprises a second transistor; wherein
a gate of the first transistor is coupled to the first control line, a first electrode of the first transistor is coupled to the first power line, and a second electrode of the first transistor is coupled to the first node; and
a gate of the second transistor is coupled to the second control line, a first electrode of the second transistor is coupled to the second power line, and a second electrode of the second transistor is coupled to the first node.

9. The display panel according to claim 1, further comprising a plurality of third control lines, a plurality of fourth control lines, and a plurality of data lines on the side of the substrate; wherein
the third circuit comprises a first sub-circuit, a second sub-circuit, a third sub-circuit, and a fourth sub-circuit; wherein
the first sub-circuit is coupled to the third control line, the data line, and a second node, and is configured to control, in response to a third control signal provided by the third control line, the data line to be connected to or disconnected from the second node;
the second sub-circuit is coupled to the fourth control line, the second node, and a third node, and is configured to control, in response to a fourth control signal provided by the fourth control line, the second node to be connected to or disconnected from the third node;

the third sub-circuit is coupled to the third node and the light-emitting element, and is configured to adjust a potential at the third node and a potential of the light-emitting element;

and the fourth sub-circuit is coupled to the third node, the first node, and the light-emitting element, and is configured to drive, based on the potential at the first node and the potential at the third node, the light-emitting element to emit light;

wherein the target circuit shared by the at least two subpixels in the same column further comprises the first sub-circuit; and the target signal line shared by the at least two subpixels in the same column further comprises the third control line.

10. The display panel according to claim 9, wherein the first sub-circuit comprises a third transistor; the second sub-circuit comprises a fourth transistor; the third sub-circuit comprises a storage capacitor; and the fourth sub-circuit comprises a fifth transistor; wherein a gate of the third transistor is coupled to the third control line, a first electrode of the third transistor is coupled to the data line, and a second electrode of the third transistor is coupled to the second node;

a gate of the fourth transistor is coupled to the fourth control line, a first electrode of the fourth transistor is coupled to the second node, and a second electrode of the fourth transistor is coupled to the third node;

a first terminal of the storage capacitor is coupled to the third node and a second terminal of the storage capacitor is coupled to the light-emitting element; and a gate of the fifth transistor is coupled to the third node, a first electrode of the fifth transistor is coupled to the first node, and a second electrode of the fifth transistor is coupled to the light-emitting element.

11. The display panel according to claim 9, further comprising a plurality of data line leads and a data line shared circuit on the side of the substrate, a number of the plurality of data line leads being less than a number of the plurality of data lines; wherein the data line shared circuit is coupled to the plurality of data lines, and is further coupled to a source drive circuit through the plurality of data line leads, and the data line shared circuit is configured to transmit a data signal transmitted by the source drive circuit to one of the data line leads to at least two of the plurality of data lines in a time-sharing manner.

12. The display panel according to claim 10, further comprising a plurality of fifth control lines and a plurality of third power lines on the side of the substrate; wherein the subpixel further comprises a fourth circuit, wherein the fourth circuit is coupled to the fifth control line, the third power line, and the third node, and is configured to control, in response to a fifth control signal provided by the fifth control line, the third power line to be connected to or disconnected from the third node.

13. The display panel according to claim 12, wherein the fourth circuit comprises a sixth transistor; wherein a gate of the sixth transistor is coupled to the fifth control line, a first electrode of the sixth transistor is coupled to the third power line, and a second electrode of the sixth transistor is coupled to the third node.

14. The display panel according to claim 12, wherein the target signal line shared by the at least two subpixels in the same column further comprises the third power line.

15. The display panel according to claim 14, wherein the third power line extends in a first direction; wherein the fourth control lines and the fifth control lines to which two subpixels disposed in two adjacent rows and sharing the third power line in the plurality of subpixels are coupled all extend in the first direction, are sequentially arranged close to the third power line-in a second direction, and are respectively distributed on two sides of the third power line, the second sub-circuits in the two subpixels in the two adjacent rows are distributed on the two sides of the third power line, the fourth circuits in the two subpixels in the two adjacent rows are distributed on the two sides of the third power line, and the second sub-circuit and the fourth circuit are sequentially arranged in a direction close to the third power line;

wherein the first direction intersects the second direction.

16. The display panel according to claim 13, wherein the second control line, the second power line, and the first control line all extend in a first direction and are sequentially arranged in a second direction, the first control line and the second control line are distributed on different sides of the second power line, and the second control line and the first control line are not equidistant from the second power line in the second direction;

in the plurality of subpixels, two subpixels disposed in two adjacent rows and sharing the first circuit, the second circuit, the first sub-circuit, the first control line, the second control line, and the third control line are arranged on two sides of the second power line, and the third power lines, the fifth control lines, and the fourth control lines to which the two subpixels in the two adjacent rows are coupled all extend in the first direction, are sequentially arranged close to the second power line in the second direction, and are respectively arranged on the two sides of the second power line;

wherein the first direction intersects the second direction.

17. The display panel according to claim 13, wherein the second power line, the second control line, and the first control line all extend in a first direction and are sequentially arranged in a second direction, the first control line and the second control line are disposed on a same side of the second power line, and the first control line and the second power line are not equidistant from the second control line in the second direction;

in the plurality of subpixels, two subpixels disposed in two adjacent rows and sharing the first circuit, the second circuit, the first sub-circuit, the first control line, the second control line, and the third control line are arranged on two sides of the second control line, and the third power lines, the fifth control lines, and the fourth control lines to which the two subpixels in the two adjacent rows are coupled all extend in the first direction, are sequentially arranged close to the second control line in the second direction, and are respectively arranged on the two sides of the second control line;

wherein the first direction intersects the second direction.

18. The display panel according to claim 1, wherein each transistor in the subpixel is an N-type transistor, and a material of the N-type transistor comprises low temperature polysilicon.

19. A display apparatus, comprising a display drive circuit and a display panel; wherein the display drive circuit is coupled to the signal lines in the display panel, and is configured to provide signals for the signal lines; and the display panel comprises:
a substrate;
a plurality of first control lines and a plurality of second control lines on a side of the substrate; and
a plurality of subpixels arranged in an array on the side of the substrate, wherein at least two of the plurality of subpixels share a first node;
wherein the subpixel comprises a first circuit, a second circuit, a third circuit, and a light-emitting element, wherein the first circuit and the second circuit are configured to control a voltage at the first node in response to a first control signal provided by the first control line and a second control signal provided by the second control line respectively, and the third circuit is coupled to the first node and the light-emitting element, and is configured to drive, in response to a potential at the first node, the light-emitting element to emit light;
wherein in the display panel, a sum of a number of the plurality of first control lines and a number of the plurality of second control lines is less than or equal to a number of the subpixels in a column direction.

* * * * *